(12) United States Patent
Shero et al.

(10) Patent No.: US 7,569,284 B2
(45) Date of Patent: Aug. 4, 2009

(54) INCORPORATION OF NITROGEN INTO HIGH K DIELECTRIC FILM

(75) Inventors: Eric J Shero, Phoenix, AZ (US); Christophe Pomarede, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 12/167,506

(22) Filed: Jul. 3, 2008

(65) Prior Publication Data

US 2008/0286589 A1     Nov. 20, 2008

Related U.S. Application Data

(62) Division of application No. 11/132,096, filed on May 17, 2005, now Pat. No. 7,405,453, which is a division of application No. 10/260,370, filed on Sep. 26, 2002, now Pat. No. 6,960,537.

(60) Provisional application No. 60/326,830, filed on Oct. 2, 2001.

(51) Int. Cl.
    B32B 15/00   (2006.01)

(52) U.S. Cl. ............... 428/610; 428/472; 428/457; 428/547; 428/702; 428/704; 257/314; 257/347; 438/85; 438/87; 438/104; 438/142; 427/248.1; 427/569

(58) Field of Classification Search ............... None
    See application file for complete search history.

(56) References Cited

U.S. PATENT DOCUMENTS

| 2,394,930 | A |   | 2/1946 | McRae |
|-----------|---|---|--------|-------|
| 3,895,127 | A |   | 7/1975 | Comizzoli |
| 3,957,474 | A | * | 5/1976 | Kobayashi et al. ............ 65/392 |
| 3,964,936 | A | * | 6/1976 | Das ............................ 148/273 |
| 4,056,642 | A |   | 11/1977 | Saxena et al. |
| 4,058,430 | A |   | 11/1977 | Suntola et al. |
| 4,247,249 | A | * | 1/1981 | Siemers .................... 415/173.4 |
| 4,292,343 | A |   | 9/1981 | Plaettner et al. |
| 4,343,830 | A |   | 8/1982 | Sarma et al. |
| 4,436,761 | A |   | 3/1984 | Hayashi et al. |

(Continued)

FOREIGN PATENT DOCUMENTS

| EP | 0 617 461 A | 9/1994 |
|----|-------------|--------|
| GB | 2372042 A | 8/2002 |
| JP | 60 254621 A | 12/1985 |
| JP | 411121453 | 4/1999 |
| JP | 02000208510 | 7/2000 |
| JP | 2000 160342 A | 10/2000 |
| JP | 2001/267566 | 9/2001 |
| JP | 2002/359370 | 12/2002 |
| WO | WO 00/54320 | 9/2000 |
| WO | WO 00/61833 | 10/2000 |

OTHER PUBLICATIONS

Abeles, et al., *Amorphous Semiconductor Superlattices*, Physical Review Letters, vol. 51, No. 21, pp. 2003-2006 (1993).

(Continued)

*Primary Examiner*—Jennifer McNeil
*Assistant Examiner*—Vera Katz
(74) *Attorney, Agent, or Firm*—Knobbe, Martens Olson & Bear, LLP

(57) ABSTRACT

A high k dielectric film and methods for forming the same are disclosed. The high k material includes two peaks of impurity concentration, particularly nitrogen, such as at a lower interface and upper interface, making the layer particularly suitable for transistor gate dielectric applications. The methods of formation include low temperature processes, particularly CVD using a remote plasma generator and atomic layer deposition using selective incorporation of nitrogen in the cyclic process. Advantageously, nitrogen levels are tailored during the deposition process and temperatures are low enough to avoid interdiffusion and allow maintenance of the desired impurity profile.

5 Claims, 10 Drawing Sheets

U.S. PATENT DOCUMENTS

| | | | |
|---|---|---|---|
| 4,544,571 A | | 10/1985 | Miller |
| 4,645,683 A | | 2/1987 | Gourrier et al. |
| 4,747,367 A | | 5/1988 | Posa |
| 4,766,006 A | | 8/1988 | Gaczi |
| 4,795,512 A | | 1/1989 | Nakatani et al. |
| 4,870,470 A | * | 9/1989 | Bass et al. ............... 257/324 |
| 4,880,614 A | * | 11/1989 | Strangman et al. ......... 428/623 |
| 4,992,306 A | | 2/1991 | Hochberg et al. |
| 5,135,775 A | | 8/1992 | Foller et al. |
| 5,281,546 A | | 1/1994 | Possin et al. |
| 5,306,666 A | | 4/1994 | Izumi |
| 5,322,725 A | * | 6/1994 | Ackerman et al. ......... 428/137 |
| 5,362,523 A | * | 11/1994 | Gorynin et al. ............ 427/446 |
| 5,449,314 A | | 9/1995 | Meikle et al. |
| 5,576,071 A | | 11/1996 | Sandhu |
| 5,576,222 A | | 11/1996 | Arai et al. |
| 5,587,205 A | | 12/1996 | Saito et al. |
| 5,619,051 A | * | 4/1997 | Endo ........................ 257/316 |
| 5,726,087 A | | 3/1998 | Tseng et al. |
| 5,780,115 A | | 7/1998 | Park et al. |
| 5,795,495 A | | 8/1998 | Meikle |
| 5,916,365 A | | 6/1999 | Sherman |
| 5,923,056 A | * | 7/1999 | Lee et al. .................... 257/192 |
| 5,939,763 A | | 8/1999 | Yin et al. |
| 5,950,107 A | | 9/1999 | Huff et al. |
| 5,990,013 A | | 11/1999 | Berenguer et al. |
| 5,993,916 A | | 11/1999 | Zhao et al. |
| 6,020,260 A | | 2/2000 | Gardner |
| 6,033,998 A | | 3/2000 | Aronowitz et al. |
| 6,063,666 A | | 5/2000 | Chang et al. |
| 6,087,229 A | | 7/2000 | Aronowitz et al. |
| 6,090,217 A | | 7/2000 | Kittle |
| 6,100,559 A | | 8/2000 | Park |
| 6,107,192 A | | 8/2000 | Subrahmanyan et al. |
| 6,110,604 A | * | 8/2000 | Rickerby ................... 428/623 |
| 6,127,284 A | | 10/2000 | Gardner et al. |
| 6,162,684 A | | 12/2000 | Chang et al. |
| 6,174,799 B1 | | 1/2001 | Lopatin et al. |
| 6,180,543 B1 | | 1/2001 | Yu et al. |
| 6,184,110 B1 | | 2/2001 | Ono et al. |
| 6,200,866 B1 | | 3/2001 | Ma et al. |
| 6,204,182 B1 | | 3/2001 | Truninger et al. |
| 6,207,587 B1 | | 3/2001 | Li et al. |
| 6,228,453 B1 | * | 5/2001 | Fareed et al. ................ 428/43 |
| 6,236,076 B1 | * | 5/2001 | Arita et al. ................. 257/295 |
| 6,245,689 B1 | | 6/2001 | Hao et al. |
| 6,271,127 B1 | | 8/2001 | Liu et al. |
| 6,294,836 B1 | | 9/2001 | Paranjpe et al. |
| 6,296,715 B1 | | 10/2001 | Kittle |
| 6,306,758 B1 | | 10/2001 | Park |
| 6,329,704 B1 | | 12/2001 | Akatsu et al. |
| 6,362,526 B1 | | 3/2002 | Pramanick et al. |
| 6,368,954 B1 | | 4/2002 | Lopatin et al. |
| 6,368,961 B1 | | 4/2002 | Lopatin et al. |
| 6,399,522 B1 | | 6/2002 | Tsan et al. |
| 6,436,848 B1 | | 8/2002 | Ramkumar |
| 6,534,395 B2 | | 3/2003 | Werkhoven et al. |
| 6,657,284 B1 | | 12/2003 | Li et al. |
| 6,696,733 B2 | | 2/2004 | Koike et al. |
| 6,703,708 B2 | | 3/2004 | Werkhoven et al. |
| 2001/0015737 A1 | | 8/2001 | Truninger et al. |
| 2001/0041250 A1 | | 11/2001 | Werkhoven et al. |
| 2002/0006468 A1 | | 1/2002 | Paranjpe et al. |
| 2002/0031658 A1 | * | 3/2002 | Chow et al. ................. 428/323 |
| 2002/0102838 A1 | | 8/2002 | Paranjpe et al. |
| 2002/0167005 A1 | * | 11/2002 | Yu et al. ....................... 257/43 |

OTHER PUBLICATIONS

*Atomic Layer Deposition Targets Thin Films*, Wafer Processing, Semiconductor International, Sep. 1999.

Bai, *High K Gate Stack for Sub-0.1 UM CMOS Technology*, Electrochemical Society Proceedings, vol. 99-100, pp. 39-44 (1999).

Del Prado, et al., *Full composition range silicon oxynitride films deposited by ECR-PECVD at room temperature*, Thin Solid Films, vol. 344, pp. 437-440 (1999).

Desu, et al, *Enhanced Dielectric Properties of Modified $Ta_2O_5$ Thin Films*, Mat Res. Innovat (1999) 2:299-302.

Guo et al., *Tunneling leakage current in oxynitride dependence on oxygen/nitrogen content*, IEEE Electron device letters, vol. 19, Jun. 1998, pp. 207-209.

Hiltunen, et al., *Nitrades of Titanium, Niobium, Tantalum and Molybdenum Grown as Thin Films by the Atomic Layer Epitaxy Method*, Thin Solid Films, 166 (1988) pp. 149-154.

Kaizuka, et al., *Conformal Chemical Vapor Deposition TiN (111) Film Formation as an Underlayer of Al for Highly Reliable Interconnects*, jpn. J. Appl. Phys. vol. 33 (1994) pp. 470-474.

Kikkawa, et al., *A Quarter-Micrometer Interconnection Technology Using a TiN/Al-Si-Cu/TiN/Al-Si-Cu/TiN/Ti Multilayer Structure*, IEEE Transactions on Electron Devices, vol. 40, No. 2, Feb. 1993.

Kikkawa, et al., *Al-Si-Cu/TiN Multilayer Interconnection and Al-Ge Reflow Sputtering Technologies for Quarter-Micron Devices*, 54/SPIE vol. 1805 Submicrometer Metallization (1992).

Kim, H. and R. Reif, *In-situ low-temperature (600° C.) wafer surface cleaning by electron cyclotron resonance hydrogen plasma . . .* , Thin Solid Films, vol. 289:192-198 (1996).

Klaus et al., *Atomically controlled growth of tungsten and tungsten nitride using sequential surface reactions*, Applied Surface Science, vol. 162-163, pp. 479-491 (2000).

Lee et al., JP 2000058777 (English Abstract) (2000).

Lee et al., *The high resistivity properties of tungsten nitride thin films deposited by rf & dc sputtering*, Proceedings of the 5$^{th}$ Intern. Conference on Properties and Applications of Dielectric Materials, May 1997, pp. 674-676.

Leskelä, et al., *Atomic Layer Epitaxy in Deposition of Various Oxide and Nitride Thin Films* , Journal De Physique IV, Colloque C5, Supplement au Journal de Physique II, vol. 5, Jun. 1995.

Lucovsky, *Integration of Alternative High-K Gate Dielectrics into Aggressively Scaled CMOS Si Devices: Chemical Bonding Constraints at Si-Dielectric Interfaces*, Electrochemical Society Proceedings, vol. 99-10, pp. 69-80 (1999).

Maiti, et al., *Improved ultrathin oxynitride formed by thermal nitridation and low pressure chemical vapor deposition process*, Applied Physics Letter, vol. 61, No. 15, pp. 1790-1792 (1992).

Martensson, et al., *Use of Atomic Layer Expitaxy for Fabrication of Si/TiN/Cu Structures*, J.Vac Sci. Technol.B 17(5), Sep./Oct. 1999, pp. 2122-2128.

Min, et al., *Atomic Layer Deposition of TiN Films by Alternate Supply of Tetrakis (ethylmethylamino)- Titatium and Ammonia*, Jpn. J. Appl. Phys. vol. 37 (1998) pp. 4999-5004.

Min, et al., *Atomic Layer Deposition of TiN Thin Films by Sequential Infroduction of Ti precursor and $NH_3$*, Mat. Res. Soc. Symp. Proc. vol. 514 (1998), Materials Research Society.

Nakajima, et al., *Atomic-layer-deposited silicon-nitride/$SiO_2$ stacked gate dielectrics for highly reliable p-metal-oxide-semiconductor filed-effect transistors*, Applied Physics Letters, vol. 77, No. 18, pp. 2855-2857 (2000).

Nakajima, et al., *Low-temperature formation of silicon nitride gate dielectrics by atomic-layer deposition*, Applied Physics Letters, vol. 79, No. 5, pp. 665-667 (2001).

Ramm J. and E. Beck, *Low temperature epitaxial growth by molecular beam epitaxy on hydrogen-plasma-cleaned silicon wafers*, Thin Solid Films, vol. 246:158-163 (1994).

Ritala, et al., *Perfectly Conformal TiN and $Al_2O_3$ Films Deposited by Atomic Layer Deposition*, Communications, Chemical Vapor Deposition 1999, 5, No. 1, pp. 7-9.

Ritala, et al., *Controlled Growth of TaN, $Ta_3N_5$, and $TaO_xN_y$ Thin Films by Atomic Layer Deposition*, Chem. Mater., vol. 11, pp. 1712-1718 (1999).

Ritala, et al., *Atomic Layer Epitaxy Growth of tiN Thin Films from $TiI_4$ $NH_3$*, J. Electrochemical Soc., vol. 145, No. 8, Aug. 1998, pp. 2914-2920.

* cited by examiner

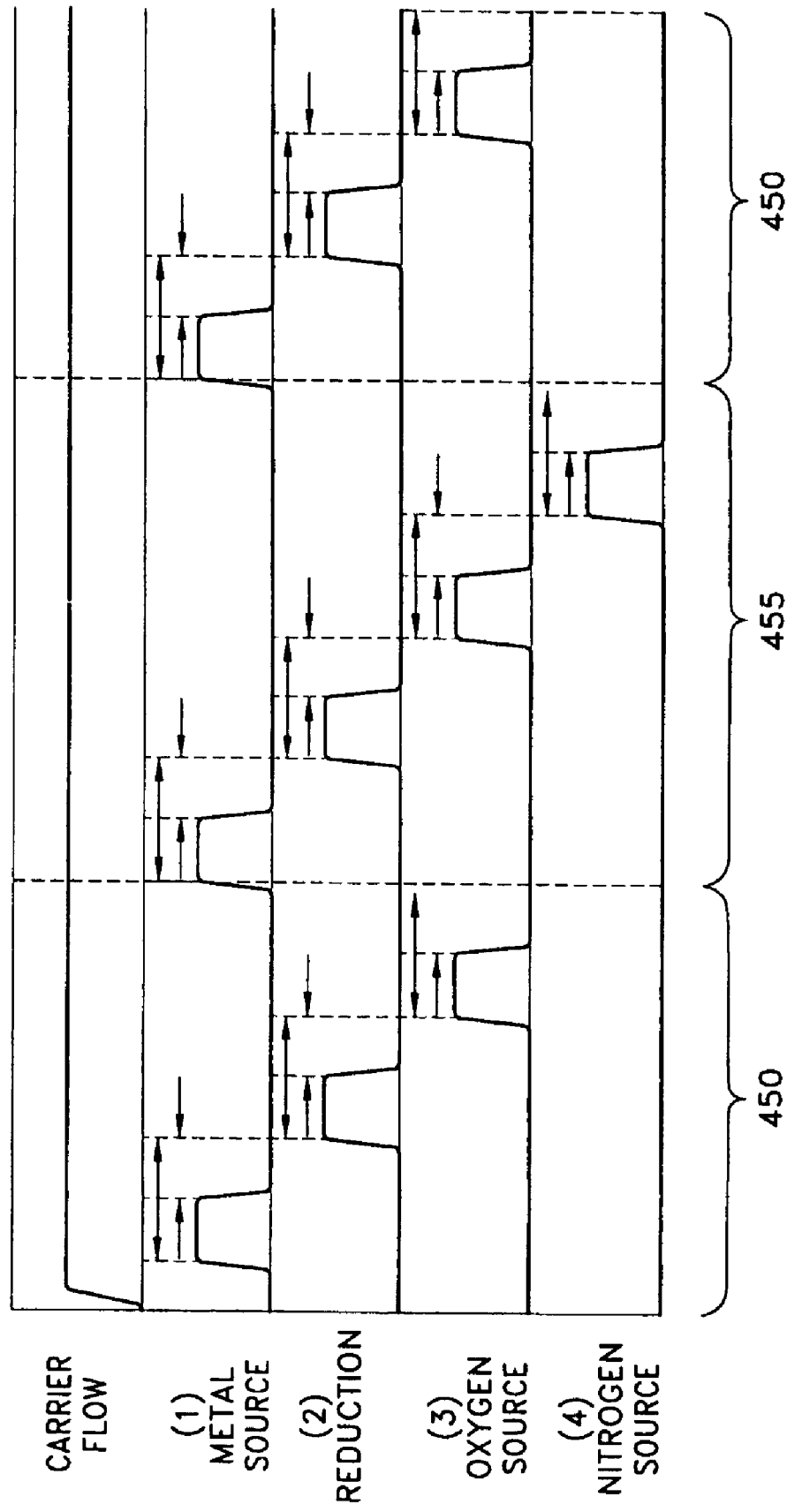

INCORPORATION OF NITROGEN INTO HIGH K DIELECTRIC FILM

REFERENCE TO RELATED APPLICATIONS

This application is a divisional of U.S. patent application Ser. No. 11/132,096, now U.S. Pat. No. 7,405,453, filed May 17, 2005, which is a divisional of U.S. patent application Ser. No. 10/260,370, now U.S. Pat. No. 6,960,537, filed Sep. 26, 2002, which claims the benefit under 35 U.S.C. § 119(e) of U.S. Provisional Patent Application No. 60/326,830, filed Oct. 2, 2001. The entire contents of each of the above-identified applications are incorporated by reference herein and made a part of this specification.

FIELD

The present invention relates generally to thin dielectric films in integrated circuits, and more particularly to nitrogen incorporation into high k gate dielectric films.

BACKGROUND

Integrated circuit design is constantly being scaled down in pursuit of faster circuit operation and lower power consumption. Scaled dimensions in a circuit design generally requires attendant changes in fabrication processing.

A basic building block of integrated circuits is the thin film transistor (TFT). As is known in the art, the transistor typically includes a gate electrode separated from a semiconductor layer or substrate by a thin gate dielectric material. Although a common acronym for state-of-the-art transistors is MOS, for metal-oxide-silicon, the material of choice for the gate electrode has long been silicon rather than metal. Among other advantages, silicon gate electrodes are able to withstand high temperature processes and enable self-aligned doping processes used for completing the transistor, thus saving expensive masking steps.

Accordingly, conventional gate electrodes are formed of polysilicon doped with conductivity-enhancing impurities, such as arsenic, phosphorus or boron. Silicon can be deposited by CVD with in situ doping by flowing a dopant source gas (e.g., arsine, phosphine, diborane, etc.) concurrently with a silicon source gas (e.g. silane). Recently, interest has been drawn to the possibility of doping silicon electrodes with germanium, thereby reducing the electrical work function of the transistor gate electrode. Accordingly, a reduced voltage is needed to operate the circuit, consequently generating less heat. Moreover, a silicon germanium gate electrode remains compatible with surrounding materials and current integrated circuit fabrication processes. Proposals for forming silicon germanium layers include in situ doping of a silicon layer by forming germane ($GeH_4$) along with silane ($SiH_4$) in a chemical vapor deposition (CVD) process.

While in situ doped CVD processes have been found to be effective in producing silicon germanium, the addition of germane to the silane flow has been found to significantly increase incubation or nucleation times over dielectric materials, particularly oxides such as silicon dioxide and some of the high-k materials discussed below. Similarly slow nucleation over dielectric materials occurs when chemical vapor depositing other gate electrode materials, such as polysilicon and particularly silicon in situ doped by flowing dopant source gases (e.g., diborane, arsine or phosphine) along with a silicon source.

Slow nucleation entails longer overall deposition times, lower throughput and consequently greater fabrication costs. The semiconductor industry is very sensitive to fabrication costs. Accordingly, any increase in wafer throughput, at any stage of processing, translates to reduced production costs and higher margins.

One way in which SiGe or other in situ doped silicon deposition has been hastened is by the first formation of a nucleation layer, typically silicon, over the gate dielectric, followed by poly-SiGe deposition. This additional step unfortunately complicates the process flow, requires adjustment of the doping concentrations at the dielectric-electrode interface to ensure the desired work function for the transistor, and does not necessarily guarantee rapid and uniform nucleation. Other recent work optimizing silicon and poly-SiGe deposition processes has also focused on increasing deposition rates while maintaining layer uniformity. For example, U.S. Pat. Nos. 5,607,724; 5,614,257; 5,700,520; 5,874,121; and 5,876,797 describe methods of depositing polysilicon at high rates by CVD under "high pressure" conditions.

Another area in which process control is particularly critical is the fabrication of transistor gate dielectrics. In the pursuit of ever faster and more efficient circuits, semiconductor designs are continually scaled down with each product generation. Transistor switching time plays a large role in the pursuit of faster circuit operation. Switching time, in turn, can be reduced by reducing the channel length of the transistors. In order to realize maximum improvements in transistor performance, vertical dimensions should be scaled along with horizontal dimensions. Accordingly, effective gate dielectric thickness, junction depth, etc. will all decrease with future generation integrated circuits. To date, this scaling has reduced gate electrode widths to less than 0.25 µm. Currently, commercial products are available employing gate widths or critical dimensions of 0.18 µm or less.

Conventional gate dielectrics are formed of high quality silicon dioxide and are typically referred to as "gate oxide" layers. Ultrathin gate oxides (less than 7 nm), however, have been found to exhibit high defect densities, including pinholes, charge trapping states, and susceptibility to hot carrier injection effects. Such high defect densities lead to leakage currents through the gate dielectric and rapid device breakdown unacceptable for circuit designs with less than 0.25 µm gate spacing, i.e., sub-quarter-micron technology.

While care under laboratory conditions can be used to control defect densities, such control has been difficult to achieve under commercial volume fabrication conditions. Moreover, even if the integrity of the oxide is perfectly maintained, quantum-mechanical effects set fundamental limits on the scaling of gate oxide. At high fields, direct tunneling dominates over Fowler-Nordheim tunneling, and largely determines oxide scaling limits. These scaling limits have been estimated at about 2 nm for logic circuits, and about 3 nm for more leakage-sensitive memory arrays in dynamic random access memory (DRAM) circuits. See, e.g., Hu et al., "Thin Gate Oxides Promise High Reliability," SEMICONDUCTOR INTERNATIONAL (July 1998), pp. 215-222.

Another problem with thin gate oxides is their susceptibility to dopant diffusion from the overlying gate electrode. A polysilicon gate electrode layer is typically doped with boron for its enhanced conductivity. As the gate oxide thickness is scaled down, boron can easily penetrate through the gate oxide, resulting in instabilities in device properties. Boron penetration into gate dielectrics has such undesirable consequences as positive shifts in threshold voltage, increases in sub-threshold swing, increases in charge trapping, decreases in low-field hole mobility, and degradation of current drive due to polysilicon depletion in p-MOSFETs.

Some efforts to address deficiencies of silicon dioxide include nitrogen incorporation into the gate dielectric. Silicon nitride ($Si_3N_4$) has a higher dielectric constant than $SiO_2$, theoretically enabling thinner equivalent oxide thickness for gate dielectrics that are not tunnel-limited, and furthermore serves as an effective barrier against impurity diffusion. However, the interfaces between silicon nitride films and the underlying semiconductor substrate are generally of poor quality, resulting in a high density of charge trapping sites and pinholes, and attendant current leakage. As a consequence, attempts have been made to create $SiO_2$ and $Si_3N_4$ hybrids, such as silicon oxynitride films, for use as gate dielectrics. Conventional methods of incorporating nitrogen into silicon oxide gate dielectrics are difficult to control, however, particularly for ultra-thin gate dielectrics of future generation devices Other solutions to scaling problems include the use of high permittivity materials ("high k"). Theoretically, incorporating materials of high k materials into the gate dielectric opens the door to further device scaling. Due to higher dielectric constant, many materials can exhibit the same capacitance as a thinner silicon dioxide layer, such that a lower equivalent oxide thickness can be achieved without tunnel-limited behavior. Some high k materials under investigation include aluminum oxide ($Al_2O_3$), zirconium oxide ($ZrO_2$), hafnium oxide ($HfO_2$), barium strontium titanate (BST), strontium bismuth tantalate (SBT), tantalum oxide ($Ta_2O_5$), etc. Such dielectrics have a dielectric constant (or k) value greater than about 7. While exhibiting greatly increased dielectric strength, these materials have been difficult to integrate with existing fabrication technology.

Similar high quality, thin dielectric layers are desirable in other contexts of integrated circuit fabrication. Integrated capacitors in memory arrays must exhibit a certain minimum capacitance for proper data storage and retrieval. Some efforts to increase capacitance for a given memory cell space have focused on the use of materials characterized by high dielectric constants (high k materials), such as those listed above.

Accordingly, a need exists for improvements in the integration of dielectric layers and conductors in semiconductor fabrication, particularly at interfaces in transistor gate stacks.

SUMMARY

In accordance with one aspect of the invention, a method is provided for forming a dielectric layer with a controlled variation in nitrogen concentration through its thickness. The method includes depositing the dielectric material onto a substrate at a substrate temperature less than about 500° C. A supply of nitrogen to the substrate is varied during deposition of the dielectric material.

In the illustrated embodiments, the nitrogen concentration forms two separate nitrogen peaks at the interfaces, with a low nitrogen concentration in the bulk portion therebetween. The supply of nitrogen is varied from a first level of nitrogen supply to a second intermediate level of nitrogen supply to a third level of nitrogen supply, wherein the second level is lower than each of the first level and the third level.

In one embodiment, the deposition method comprises providing a variable supply of nitrogen excited species through a remote plasma generator. In another embodiment, the deposition method comprises varying an amount of nitrogen supplied to an atomic layer deposition (ALD) process. For example, an arrangement is provided in which nitrogen and oxidant source gases are simultaneously supplied in an ALD process, with varying ratios in different cycles. Another arrangement is provided in which a separate nitrogen pulse is provided with varying frequency, depending upon the stage of deposition.

In accordance with another aspect of the invention, a dielectric layer is provided in an integrated circuit. The dielectric layer comprises a metal oxide throughout a thickness of the dielectric layer, which metal oxide has a dielectric constant greater than about 7. The dielectric layer includes a lower interface having a first nitrogen concentration, a bulk portion having a second nitrogen concentration lower than the first nitrogen concentration, and an upper interface having a third nitrogen concentration higher than the second nitrogen concentration.

BRIEF DESCRIPTION OF THE DRAWINGS

The invention will be better understood from the detailed description of the preferred embodiments and from the appended drawings, which are meant to illustrate and not to limit the invention, and wherein:

FIG. 11 is an exemplary gas flow diagram in accordance with another preferred ALD method of depositing ultrathin dielectric layers with controlled nitrogen content.

DETAILED DESCRIPTION OF THE PREFERRED EMBODIMENT

While the preferred embodiments are described in the context of transistor gate stacks, the skilled artisan will readily appreciate that the principles disclosed herein have application to a variety of contexts in which thin high k materials require a graded composition, particularly those having special interface needs. An example of such a context is in the formation of capacitors including high k dielectrics, proposed for high density memory cells in random access memory (RAM) arrays. The methods described herein are particularly advantageous for maintaining the stability of and preventing diffusion to or from high k materials.

Conventional gate electrode deposition over high k gate dielectrics has been found to result in poor electrical performance of the resultant devices. In order to increase the reliability and yield of the integrated circuits including high k dielectrics, the present invention provides a varied composition for a high k dielectric, whereby nitrogen incorporation is highest near both upper and lower interfaces. Accordingly, two nitrogen peaks are produced through the thickness of the dielectric. Moreover, the processes provided herein provide excellent control by varying the nitrogen supply during low temperature dielectric formation, rather than in post-formation nitridation steps, and avoiding the diffusion problems inevitably faced during high temperature deposition.

Prior to describing the processes in greater detail, exemplary reactors for depositing layers by chemical vapor deposition (CVD) or atomic layer deposition (ALD) are first described below. Other reactor configurations may be used. For example, while not illustrated separately, the ALD processes described below can also be performed in a Pulsar™ 2000 ALCVD™ Reactor, commercially available from ASM Microchemistry Oy of Espoo, Finland.

CVD Reactor

Figure 1:
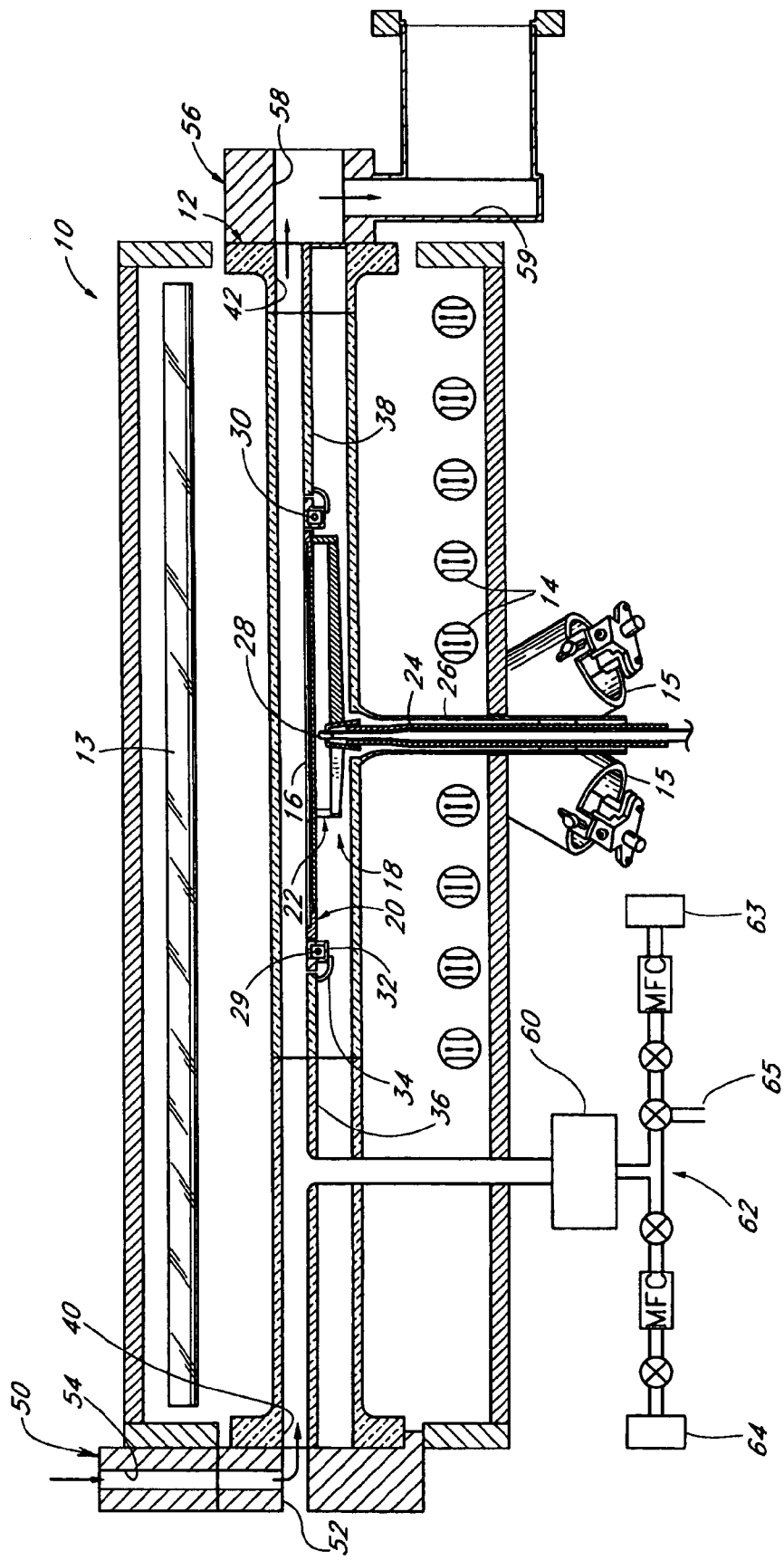
FIG. 1 is a schematic sectional view of an exemplary single-substrate vapor deposition reaction chamber.

FIG. 1 shows a vapor deposition reactor 10, including a quartz process or reaction chamber 12, constructed in accordance with a preferred embodiment, and for which the methods disclosed herein have particular utility. While originally designed to optimize epitaxial chemical vapor deposition (CVD) of silicon on a single substrate at a time, the inventors have found the superior processing control to have utility in a number of different types of vapor deposition. For example, the ALD processes described hereinbelow can be conducted in the illustrated CVD reactor of FIG. 1, preferably with adjustments to the inlet flange to avoid intermixing separate reactant pulses prior to entry in the reaction chamber. Moreover, the illustrated reactor 10 can safely and cleanly accomplish multiple treatment steps sequentially in the same chamber 12. The basic configuration of the reactor 10 is available commercially under the trade name Epsilon™ from ASM America, Inc. of Phoenix, Ariz. It will be understood, however, that the processes described herein are applicable and have utility in a number of different reactor configurations. Most preferably, the Epsilon™ reactor of FIG. 1 is employed for plasma enhanced or assisted CVD of dielectric materials, in accordance with processes described below. The chamber of FIG. 1 can also be employed for CVD of electrode materials in a cluster tool along with an ALD module (see FIGS. 2A to 2C) for ALD of dielectric materials in accordance with processes described below.

In the illustrated reactor 10, a plurality of radiant heat sources are supported outside the chamber 12 to provide heat energy in the chamber 12 without appreciable absorption by the quartz chamber 12 walls. While the preferred embodiments are described in the context of a "cold wall" reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying reaction chamber 12. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates (not shown) above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A substrate, preferably comprising a silicon wafer 16, is shown supported within the reaction chamber 12 upon a substrate support structure 18. Note that, while the substrate of the illustrated embodiment is a single-crystal silicon wafer, it will be understood that the term "substrate" broadly refers to any surface on which a layer is to be deposited. Moreover, the principles and advantages described herein apply equally well to depositing layers over numerous other types of substrates, including, without limitation, glass substrates such as those employed in flat panel displays.

The illustrated support structure 18 includes a substrate holder or susceptor 20, upon which the wafer 16 rests, and a support spider 22. The spider 22 is mounted to a rotating shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

A plurality of temperature sensors are positioned in proximity to the wafer 16. The temperature sensors may take any of a variety of forms, such as optical pyrometers or thermocouples. The number and positions of the temperature sensors are selected to promote temperature uniformity, as will be understood in light of the description below of the preferred temperature controller. Preferably, however, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). Each of the peripheral thermocouples are housed within a slip ring 32, which surrounds the substrate holder 20 and the wafer 16. Each of the central and peripheral thermocouples are connected to a temperature controller, which sets the power of the various heating elements 13, 14, 15 in response to the readings of the thermocouples. The slip ring 32 can be suspended by any suitable means. For example, the illustrated slip ring 32 rests upon elbows 34 that depend from a front chamber divider 36 and a rear chamber divider 38. The dividers 36, 38 desirably are formed of quartz. In some arrangements, the rear divider 38 can be omitted.

The illustrated reaction chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and the outlet 42. An inlet component 50 is fitted to the reaction chamber 12, adapted to surround the inlet port 40, and includes a horizontally elongated slot 52 through which the wafer 16 can be inserted. A generally vertical inlet 54 receives gases from remote sources, as will be described more fully below, and communicates such gases with the slot 52 and the inlet port 40. The inlet 54 can be modified from the original Epsilon® design for CVD and instead be configured to keep the gas flow from different ALD precursor sources separate until entry into the chamber 12, in order to avoid CVD-like reactions. An outlet component 56 also mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. A pump or fan is preferably included to aid in drawing process gases through the chamber 12, and to evacuate the chamber for low pressure processing.

The illustrated reactor 10 also includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TRW-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. A source of carrier gas 64 is also coupled to the gas line 62. One or more further branch lines 65 can also be provided for additional reactants. As is known in the art, the gas sources 63, 64 can comprise gas tanks, bubblers, etc., depending upon the form and volatility of the reactant species. Each gas line can be provided with a separate mass flow controller (MFC) and valves, as shown, to allow selection of relative amounts of carrier and reactant species introduced to the excited species generator 60 and thence into the reaction chamber 12. It will be understood that, in other arrangements, the excited species can be generated within or immediately adjacent the process chamber (see FIGS. 2A to 2C and corresponding text).

Wafers are preferably passed from a handling chamber (not shown), which is isolated from the surrounding environment, through the slot 52 by a pick-up device. The handling chamber and the processing chamber 12 are preferably separated by a gate valve (not shown) of the type disclosed in U.S. Pat. No. 4,828,224, the disclosure of which is hereby incorporated herein by reference.

The total volume capacity of a single-wafer process chamber 12 designed for processing 200 mm wafers, for example, is preferably less than about 30 liters, more preferably less than about 20 liters, and most preferably less than about 10. The illustrated chamber 12 has a capacity of about 7.5 liters. Because the illustrated chamber 12 is divided by the dividers 36, 38, wafer holder 20, ring 32, and the purge gas flowing from the tube 26, however, the effective volume through which process gases flow is around half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer processing chamber 12 of the illustrated type, but for 300 mm wafers, preferably has a capacity of less than about 100 liters, more preferably less than about 60 liters, and most preferably less than about 30 liters. One 300 mm wafer processing chamber has a total volume of about 24 liters, with an effective processing gas capacity of about 11.83 liters.

As mentioned, a plurality of vapor-phase precursor sources (not shown) are connected to the inlet 54 via gas lines with attendant safety and control valves, as well as mass flow controllers ("MFCs"), which are coordinated at a gas panel. The gas sources can include, for example, a source of carrier gas (e.g., $H_2$ or $N_2$); metal precursors (e.g., $ZrCl_4$, $HfCl_4$, $WF_6$, $TiCl_4$, $CuCl$, etc.); an oxidant source gas (e.g., $O_2$, $O_3$, O radicals, $H_2O$, NO, $N_2O$, etc.); a nitrogen source gas (e.g., $NH_3$, $N_2$, NO, $N_2O$, hydrazine, etc.); a silicon source (e.g., $SiH_4$, $Si_2H_6$, $Si_3H_8$, $Si_4H_{10}$, DCS, TCS; a source of germanium (e.g., $GeH_4$); dopant sources (e.g., phosphine, arsine and diborane); and etchants for cleaning the reactor walls and other internal components (e.g., HCl or $NF_3/Cl_2$. The vapor-phase sources can include liquid reactant sources in a bubbler, and a gas line for bubbling and carrying vapor phase reactants from the bubbler to the reaction chamber 12.

Process gases are communicated to the inlet 54 in accordance with directions programmed into a central controller (including a memory and a microprocessor) and distributed into the process chamber 12 through injectors. After passing through the process chamber 12, unreacted process gases and gaseous reaction by-products are exhausted to a scrubber to condense environmentally dangerous fumes before exhausting to the atmosphere.

ALD Reactors with Remote Plasma Chambers

Figure 2A:
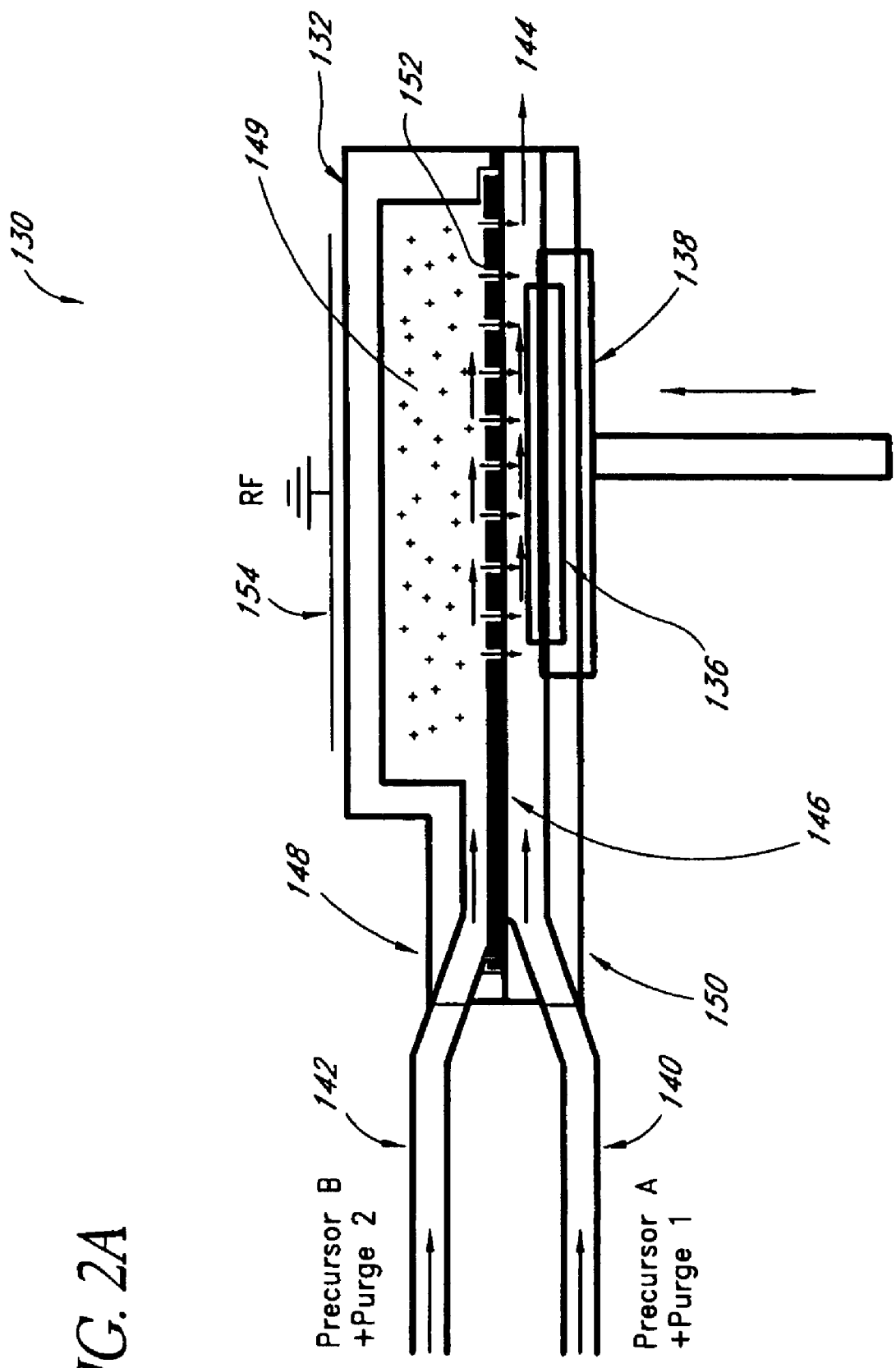
FIGS. 2A-2C are schematic sectional views of single-substrate vapor reaction chambers, particularly configured for conducting atomic layer deposition with remote plasma processing in accordance with certain preferred embodiments.

FIG. 2A illustrates one embodiment of an ALD or ALE reactor 130 having certain features and advantages according to the present invention. The illustrated embodiment includes a reaction chamber 132, which defines a reaction zone. A wafer or substrate 136 is disposed within the reaction chamber 132 and is supported by a pedestal 138, which preferably is configured to open the chamber 132 and move the substrate 136 in and out of the reaction chamber 132. In a modified arrangement, the reactor 130 can include a wafer inlet/outlet port and an external robot with a robot arm.

In the illustrated embodiment, two precursors are supplied to the reaction chamber 132. The first precursor is supplied to the reaction chamber 132 through a first precursor conduit 140. In a similar manner, the second precursor is supplied to the reaction chamber 132 through a second precursor supply conduit 142. Each supply conduit is connected to a precursor supply source (not shown) and preferably a purge gas source (not shown). The purge gas is an inert gas and can be, by way of example, nitrogen or argon. The purge gas can also be used as a carrier gas to transport the first and/or second precursors. The reactor 130 also includes an exhaust 144 for removing material from the reactor chamber 132.

A showerhead plate 146 is positioned within the reaction chamber 132. Preferably, the showerhead plate 146 is a single integral element. The showerhead plate 146 preferably spans across the entire reaction zone and divides the reaction chamber 132 into an upper chamber 148, defining a plasma cavity 149, and a lower chamber 150. The showerhead plate 146 defines, at least in part, a plurality of passages 152 that connect the upper chamber 148 to the lower chamber 150. In the illustrated embodiment, such passages 152 are formed by providing small holes in the showerhead plate 146 that are located generally above the substrate 136. In this manner, the showerhead plate 146 substantially prevents the second precursor from entering the lower chamber 150 until the flow from the second conduit 142 is generally above the substrate 136.

As noted, the upper chamber 148 of the illustrated reaction chamber 132 defines the separate plasma cavity 149 for creating in-situ radicals. Such in-situ radicals can be used to facilitate reactions on the surface of the substrate. To create the in-situ radicals, a plasma can be created within the plasma cavity 149 in a variety of ways, such as, for example, using a capacitor electrode positioned inside or outside the plasma cavity (i.e., a capacitively coupled plasma), a RF coil (i.e., a inductively coupled plasma), light, ionizing radiation, heat (e.g., heated tungsten filament can be used to form hydrogen radicals from hydrogen molecules), and/or chemical reactions to generate the plasma.

In embodiment of FIG. 2A, a capacitor electrode 154 is positioned outside the reaction chamber 132 and the plasma cavity 149. The showerhead plate 146 is positioned between the plasma cavity 149 and the substrate 136 and, in the illustrated embodiment, is also used as the other electrode. This embodiment has several advantages. For example, even if the radicals are very short-lived, the path to the growth surface (i.e., the substrate 136) is short enough to guarantee their contribution to the growth reaction. Also the upper chamber 148 can be made large enough to provide necessary space for plasma ignition and also to separate the plasma from the growth surface thus protecting it from the damaging effects of the energetic particles and charges in the plasma.

Figure 2B:
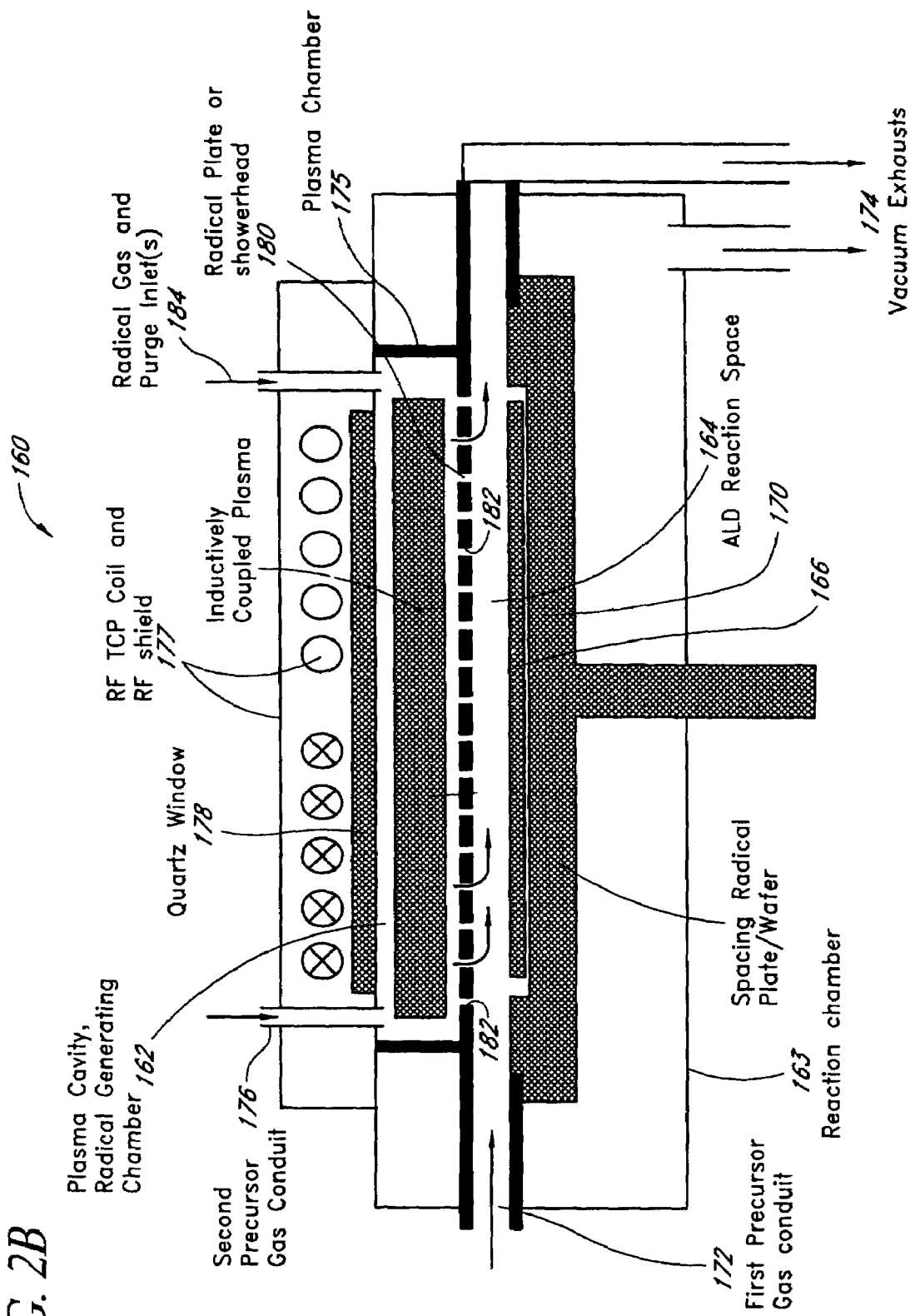

FIG. 2B illustrates a modified embodiment of a reactor 160 that also utilizes plasma cavity 162. In this embodiment, the reactor 160 includes a reaction chamber 163, which defines a reaction space 164. A substrate 166 is positioned within the reaction space and is supported by a wafer holder 170, which can be heated. A first precursor is introduced into the reaction space via a first supply conduit 172. Preferably the first supply conduit 172 and the reaction chamber 163 are arranged such that the flow of the first precursor within the reaction chamber is generally parallel to a reaction surface of the substrate 166. An exhaust 174 and a pump (not shown) are preferably provided for removing material from the reaction chamber 163.

The reactor 160 also includes an upper chamber 175 defining the plasma cavity 162, which, in the illustrated embodiment, is located generally above the reaction space 164. The upper chamber 175 defines the plasma cavity 162 in which the in-situ radicals are generated. To generate the radicals, a second precursor is introduced into the plasma cavity 162 via a second supply conduit 176. Radicals and other excited species are generated from the plasma that is generated in the upper chamber 175. To generate the plasma, the illustrated embodiment utilizes a planar RF TCP coil and RF shield 177, which are separated from the plasma cavity 162 by a window 178 made of, for example, quartz. An example of such a planar induction coil is described in the Journal of Applied Physics, Volume 88, Number 7, 3889 (2000) and the Journal of Vacuum Science Technology, A 19(3), 718 (2001), which are hereby incorporated by reference herein.

The plasma cavity 162 and the reaction space 164 are separated by a radical or showerhead plate 180. The showerhead plate 180 preferably defines a plurality passages 182 through which radicals formed in the plasma cavity can flow into the reaction space 164. Preferably, the flow through the passages 182 is generally directed towards the reaction surface of the substrate 166. In some embodiments, the space between the showerhead plate 180 and the substrate 166 can be as small as a few millimeters. Such an arrangement provides ample radical concentration at the wafer surface, even for short-lived radicals.

In some embodiments, purge gases can be continuously supplied to the plasma cavity 162 through a purge inlet 184. In such an embodiment, the upper chamber 175 can operate at a substantially constant pressure regime. In other embodiments, the showerhead plate 180 and surrounding components adjacent to the reaction chamber 163 may be heated, either as a result of the plasma on one side on the showerhead plate 180 and/or a heated wafer holder 170 on the other side, or by separately heating the showerhead plate 180.

In some embodiments, the RF power can be used to alternately switch the radical concentration in the flow. In other embodiments, the supply of precursors to the plasma cavity can be alternately switched. Preferably, there is a continuous flow from the plasma cavity 162 to the reaction space 164. Continuous flow of gases, i.e., radicals alternated with inert gas, is preferred because it prevents the first precursor in the reaction space 164 below from contaminating the plasma cavity 162. This facilitates the deposition of conductive compounds without arcing. There is also preferably a positive pressure differential between the plasma cavity 162 and the reaction space 164 with the pressure in the plasma cavity 162 being larger. Such an arrangement also promotes plasma ignition in the upper chamber 175.

Figure 2C:
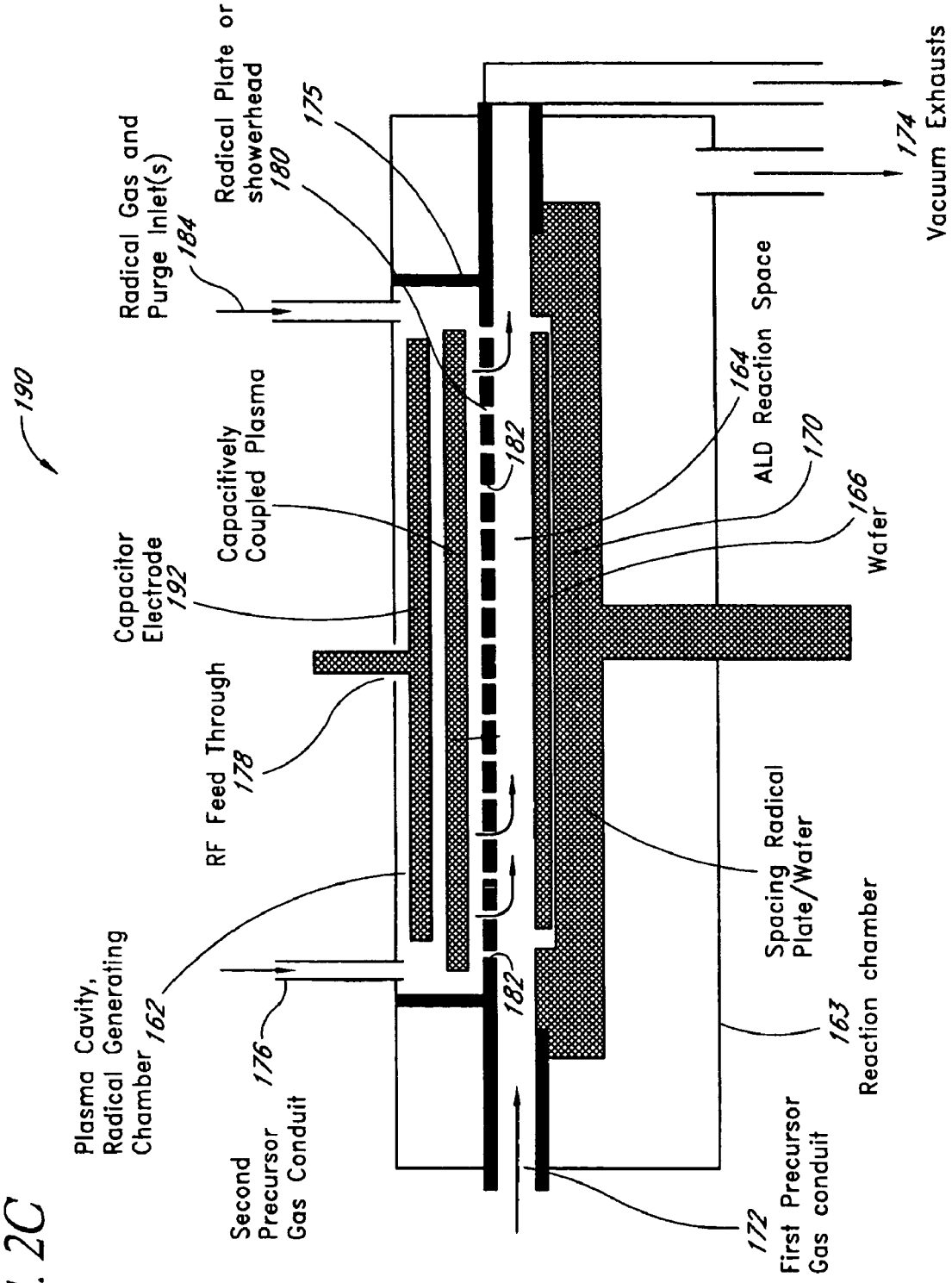

FIG. 2C illustrates another modified embodiment of an ALD or ALE reactor 190 that also utilizes a plasma cavity. Like numbers are used to refer to parts similar to those of FIG. 2B. In this embodiment, the plasma in the plasma cavity 162 is capacitively coupled. As such, the illustrated embodiment includes a capacitor electrode 192, which is disposed in the plasma cavity 162 above the showerhead plate 180. This arrangement is similar to the arrangement shown in FIG. 2A, except that the electrode is positioned inside the reaction chamber 163.

General Process Flow

Figure 3:
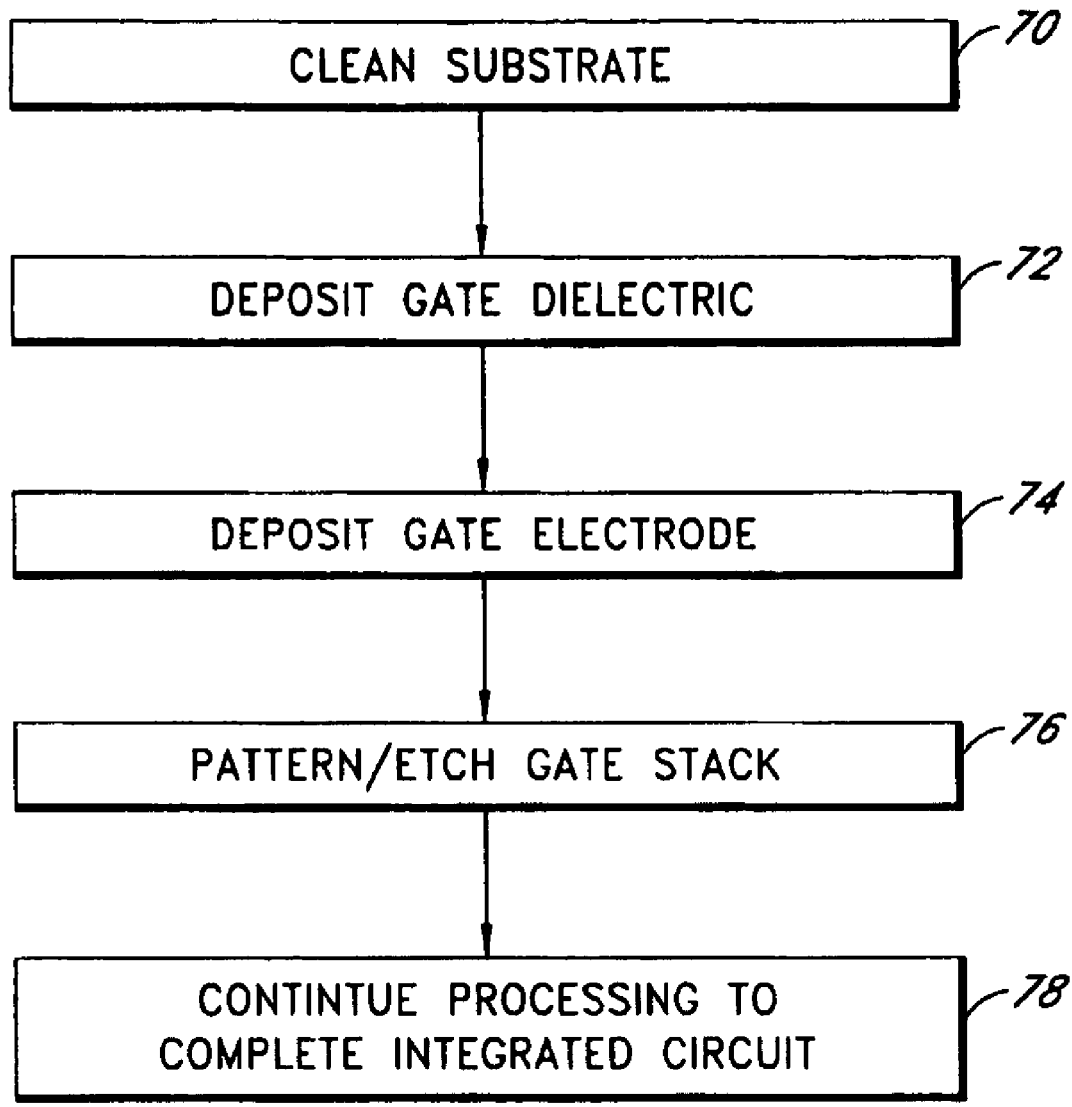
FIG. 3 is a flow chart illustrating a general sequence for forming conventional transistor gate stacks.
Figure 4:
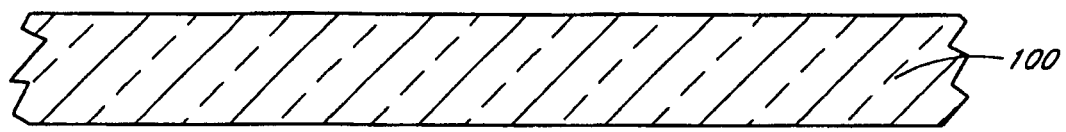
FIG. 4 is a schematic cross-section of a portion of a semiconductor substrate, representing the upper surface of a workpiece in accordance with the preferred embodiments.

Referring to FIG. 3, a general process sequence for forming a transistor gate stack on a semiconductor substrate is shown. A substrate is first cleaned 70 and then a gate dielectric is deposited 72. In accordance with the preferred embodiments, described in more detail below, the gate dielectric desirably comprises a high k material with high nitrogen content at both upper and lower interfaces and low nitrogen content in the bulk therebetween. Following gate dielectric deposition 72, a gate electrode is deposited 74, the gate is patterned and etched 76 (such as by conventional photolithographic processes). In some arrangements, the substrate is subjected to source/drain reoxidation after patterning, prior to continuing processing 78 to complete the integrated circuit.

Referring now to FIGS. 4-8, the result of the above process is shown. With initial reference to FIG. 4, a semiconductor substrate 100 is provided on or in a workpiece. The semiconductor substrate 100 typically comprises an epitaxial silicon layer or the upper surface of a single-crystal, intrinsically doped silicon wafer, although the skilled artisan will appreciate that other semiconductor materials (e.g. III-V materials) can be substituted.

Prior to the illustrated process, the substrate is first cleaned to remove contaminants and naturally occurring or native oxide on the semiconductor structure. Conventionally, wafer cleaning prior to gate oxide growth is conducted ex situ prior to loading the wafer into the process chamber. For example, wafers may be cleaned in an SC1/HF wet etch bath. Alternatively, an integrated HF and acetic acid vapor clean can be conducted in a neighboring module within a cluster tool, reducing transport time and opportunity for recontamination or reoxidation. For some applications, the cleaning oxide left by the SC1 step is not removed, but is instead used as the initial oxide layer. In another possibility, a hydrogen bake step can be conducted within the chamber to sublimate native oxide. Small amounts of HCl vapor can be added to this step to aid in cleaning metal contaminants and the like during the hydrogen bake. In still another arrangement, plasma products can assist or conduct in situ cleaning, such as by substituting H radicals for hydrogen gas.

Either after ex situ cleaning, or prior to in situ cleaning, the wafer or other substrate is loaded into the process chamber. Cleaning of native oxide tends to leave a hydrogen-terminated surface, which advantageously inhibits spontaneous reoxidation upon exposure to the clean room environment or other source of oxidants. Such hydrogen termination may need to be desorbed prior to further processes.

Figure 5:
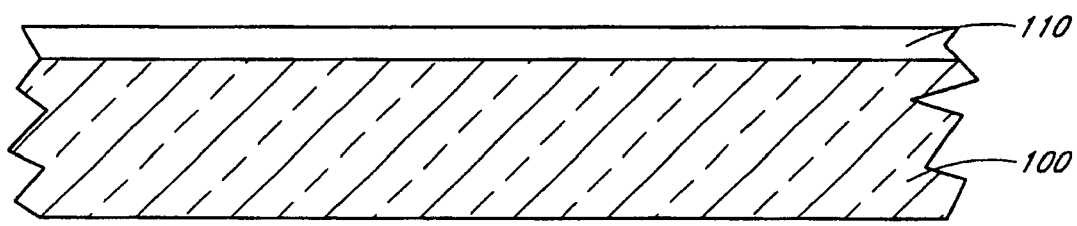
FIG. 5 illustrates the substrate in FIG. 4 after formation of a high k gate dielectric layer over the substrate surface.

With reference now to FIG. 5, a high k dielectric layer 110 is formed over the substrate 100. Preferred methods of forming the high k dielectric layer 110 are described in more detail below.

Figure 6:
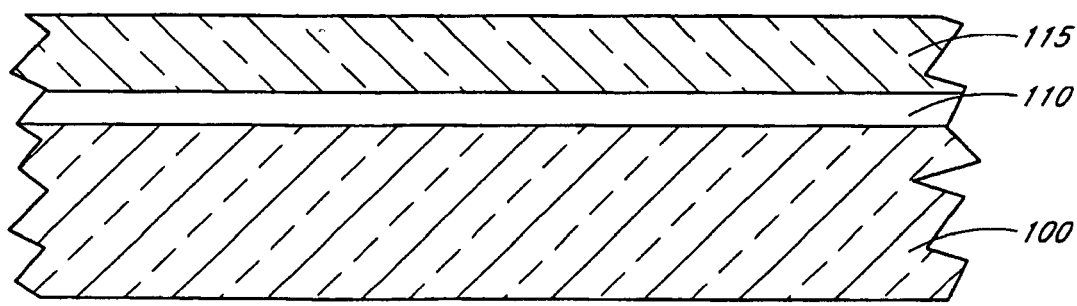
FIG. 6 illustrates a silicon-containing seed layer deposited directly over the gate dielectric layer of FIG. 5.
Figure 7:
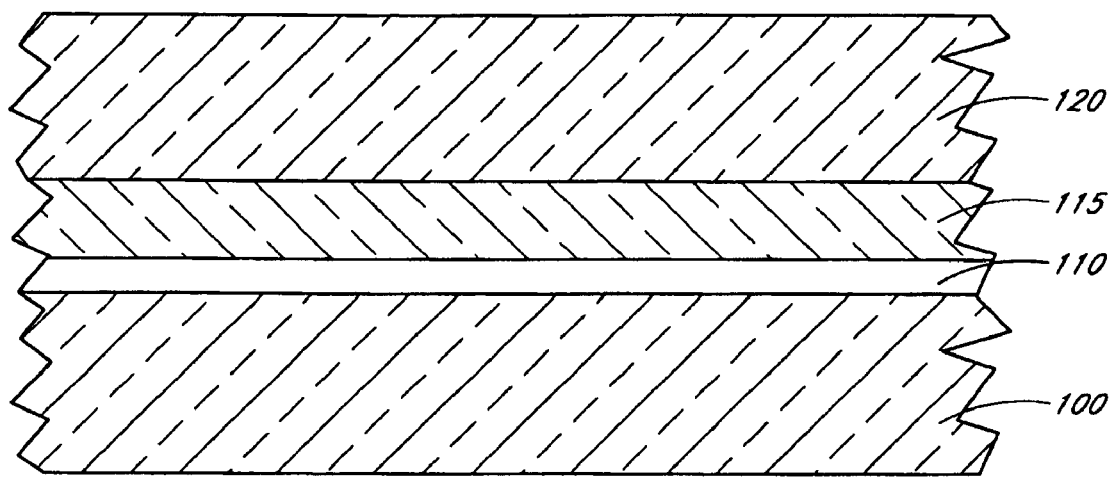
FIG. 7 illustrates a silicon-containing bulk layer deposited directly over the seed layer of FIG. 6.
Figure 8:
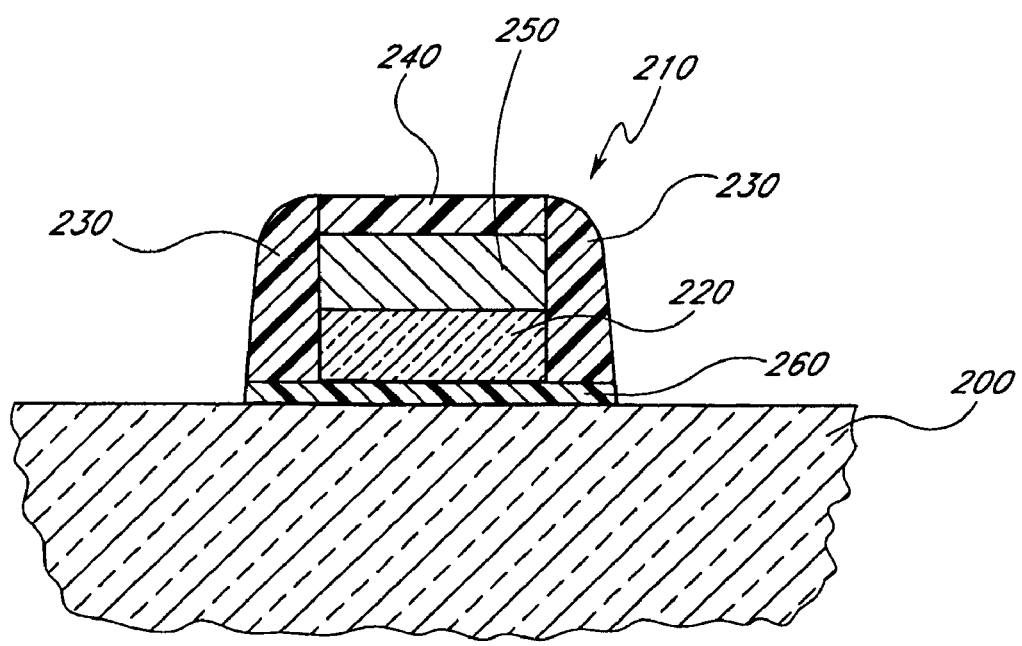
FIG. 8 is a schematic section of a transistor gate stack constructed in accordance with preferred embodiments of the invention.

Referring now to FIGS. 6-7, a seed or wetting layer 115 is optionally deposited directly over the cleaned surface of the gate dielectric 110, followed by a bulk silicon-containing layer 120 over the silicon-containing seed layer 115. With or without the seed layer, the deposition preferably takes place within the preferred single wafer CVD reactor of FIG. 1, available under the trade name Epsilon™ from ASM America of Phoenix, Ariz. If employed, the wetting layer 115 is generally indistinguishable from the overlying bulk layer 120, and so is typically not apparent in the final structure (FIG. 8).

The gate electrode 115, 120 preferably contains silicon and is CVD deposited. For example, the gate electrode can comprise a CVD polysilicon, doped or undoped, or a silicon germanium alloy, preferably having the form $Si_{1-x}Ge_x$. Gate electrode formation typically comprises two stages, as illustrated in FIGS. 6-7: a seed phase and a bulk phase. The silicon seed or wetting layer 115 serves to improve nucleation relative to direct deposition of SiGe. If included, conditions are arranged in the seed phase to minimize chemical reduction of the underlying high k. The illustrated high k material comprises $HfO_2$ or $ZrO_2$, which has been found particularly susceptible to reduction during conventional polysilicon or poly-SiGe deposition. A low reduction seed layer deposition is described in U.S. provisional patent application No. 60/279,256, filed Mar. 27, 2001, entitled INTEGRATION OF HIGH K GATE DIELECTRIC, the disclosure of which is incorporated herein by reference. Conditions can then be arranged in the bulk phase to increase the deposition rate, relative to that of the previous step.

However, as noted below, the preferred high k dielectric 110 includes a relatively high nitrogen content at the upper interface. Accordingly, reduction of the high k dielectric may be sufficiently attenuated to avoid special low-reduction seed processing. Further, high nitrogen content at the upper interface can also improve subsequent nucleation of the gate electrode (e.g., Si, SiGe and particularly in situ doped Si and SiGe). Accordingly, the seed phase can be omitted.

Having completed the gate stack, further processing to complete the integrated circuit follows. For example, gate stacks typically are insulated by blanket deposition of a dielectric and spacer etch. Transistor active areas are then doped to form source and drain regions on either side of the patterned electrodes, and wiring or "back end" processes complete the circuit.

FIG. 8 illustrates a transistor gate formed after patterning and etching the layers described above. In particular, a semiconductor substrate 200 is shown with a transistor gate stack 210 formed thereover. In the illustrated embodiment, the substrate 200 comprises an upper portion of a single-crystal silicon wafer, though the skilled artisan will appreciate that the substrate can also comprise other semiconductor materials. The gate stack 210 includes a polysilicon or poly-SiGe gate electrode layer 220. Sidewall spacers 230 and an insulating layer 240 protect and isolate the electrode 220 in a conventional manner. Also illustrated is a more highly conductive strapping layer 250, typically including metal, over the silicon-containing gate electrode layer 220. The strap 250 facilitates rapid signal propagation among transistor gates across the wafer, connecting the gates to logic circuits.

A gate dielectric 260, formed by the exemplary processes described below, separates the gate electrode 220 from the substrate 200. As noted in the Background section above, the gate dielectric 260 is a critical feature in the pursuit of denser and faster circuits.

Note that integrated circuit transistors can have a variety of forms that do not all resemble that of FIG. 8. The graded dielectric layer of the preferred embodiments, however, will have application to gate dielectric layers in a variety of transistor types (e.g., heterojunction BiCMOS transistors), as well as to a variety of other ultrathin dielectric layers having other functions within an integrated circuit (e.g., capacitor dielectric, tunneling dielectric, etc.).

Preferred High K Dielectric

As noted in the Background section, high k materials are generally forms of metallic oxide with k values greater than about 7, including aluminum oxide ($Al_2O_3$), zirconium oxide ($ZrO_2$), hafnium oxide ($HfO_2$), tantalum oxide ($Ta_2O_5$), barium strontium titanate (BST), strontium bismuth tantalate (SBT), and lanthanide oxides. The last listed dielectrics include oxides of such physically stable "rare earth" elements as scandium (Sc), yttrium (Y), lanthanum (La), cerium Ce, praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu). The high k material of the preferred embodiments can comprise any of the above-mentioned materials. Most preferably, high k materials incorporated into the dielectric layer of the illustrated embodiments comprise oxides of Group 4 metals, particularly zirconium oxide ($ZrO_2$) hafnium oxide ($HfO_2$), and have a dielectric constant greater than about 10.

The preferred high k dielectric layer incorporates high k material throughout the thickness of the layer, and furthermore incorporate a controlled amount and distribution of an impurity, particularly nitrogen. Preferably, this impurity is incorporated to a greater extent at upper and lower interfaces of the dielectric material, and is incorporated during the deposition process. Thus, two separate nitrogen peaks are provided through the thickness of the dielectric.

Figure 9:
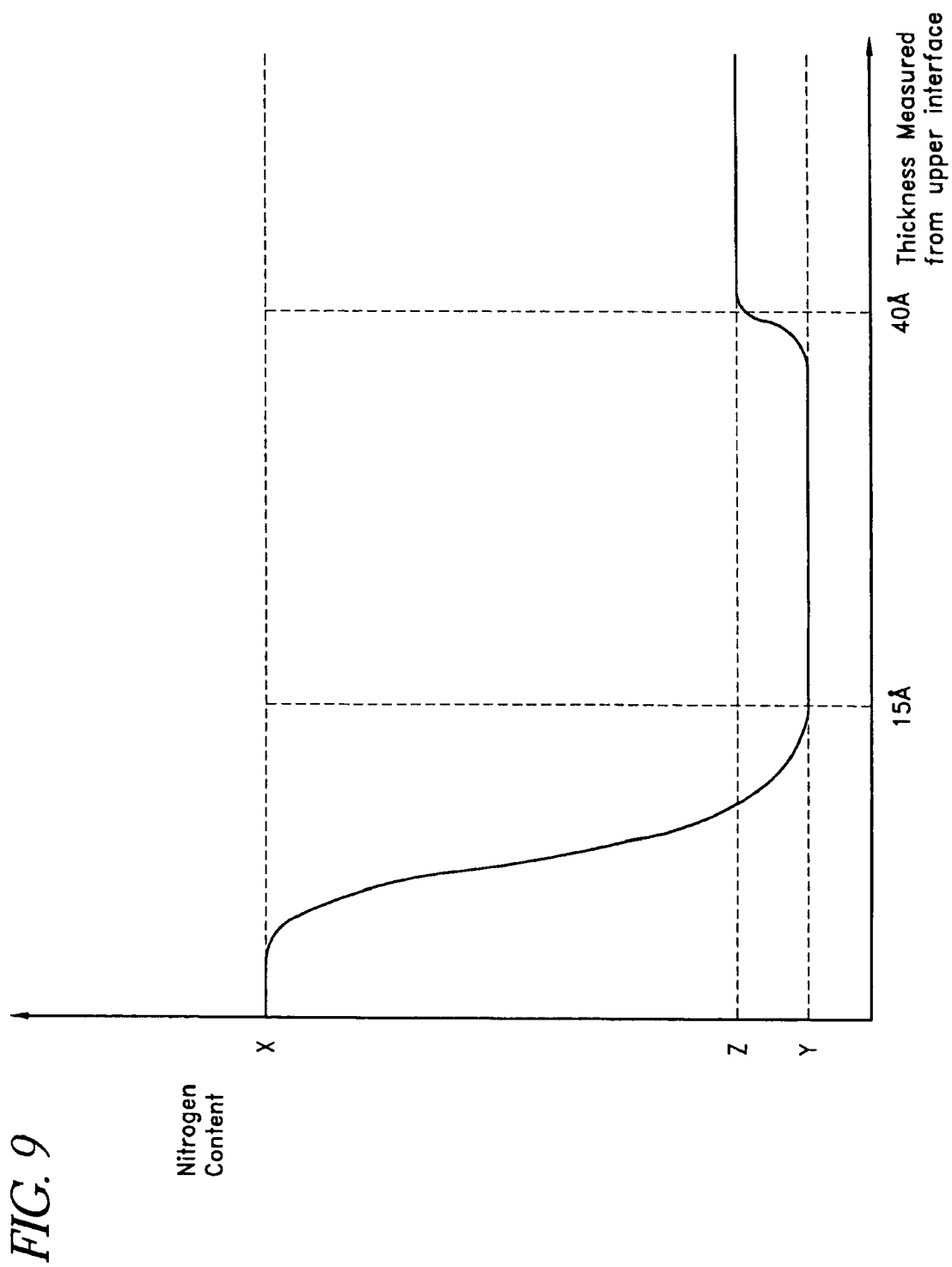
FIG. 9 is a theoretical Auger profile of the preferred dielectric layer, showing relative nitrogen content levels through the thickness.

FIG. 9 illustrates a theoretical Auger profile showing nitrogen content through the thickness of the preferred high k dielectric. The left side of the graph represents the upper or top interface between the dielectric and the overlying gate electrode, showing an impurity concentration peak of X. The right side of the graph represents the lower or bottom interface between the dielectric and the semiconductor substrate surface, showing an impurity concentration peak of Y. A bulk portion of the layer between the two separate impurity concentration peaks has a minimum impurity concentration level generally indicated by Z.

Preferably, the dielectric upper interface includes between about 1% and 10% atomic ratio of nitrogen and is preferably between about 5 Å and 20 Å in thickness, more preferably between about 5 Å and 10 Å. Typically, a higher nitrogen content in the metal oxide results in a higher amorphous content. Advantageously, this top interface serves to protect the bulk of the high k material from diffusion of impurities (e.g., electrical dopants such as boron) from the overlying gate electrode and to inhibit silicidation reactions between the overlying gate electrode and the high k material, thereby maintaining thermal stability of the high k material, particularly during subsequent source/drain reoxidation. Moreover, nitrogen content at the upper interface desirably facilitates nucleation during deposition of the overlying gate electrode, particularly SiGe, while resisting diffusion of reducing agents (e.g., hydrogen) during such deposition. Reducing agents can disadvantageously convert the high k dielectric to metallic conductors and cause electrical leakage paths through the dielectric.

The bulk of the dielectric preferably includes less than about 0.1% (atomic ratio) nitrogen, more preferably less than about 0.01% nitrogen, and for the illustrated gate dielectric function is between about 20 Å and 30 Å in thickness. Advantageously, low nitrogen content in the bulk of the illustrated high k material improves overall film quality. Substantially pure metal oxide (e.g., $ZrO_2$ or $HfO_2$) in the bulk avoids undercoordinated dangling bonds, which can otherwise form charge trap sites.

The lower interface preferably includes greater than about 0.1% (atomic ratio) nitrogen, more preferably between about 0.1% and 1% nitrogen. Preferably the lower interface with this content has a thickness between about 5 Å and 10 Å, more preferably closer to about 5 Å. The nitrogen content at this lower interface advantageously improves interface reliability at the substrate and inhibits oxidation of the substrate during high k deposition and subsequent processing. Such oxidation can disadvantageously lower the effective permittivity (k value) of the gate dielectric. The nitrogen level is lower than that of the upper interface, however, to reduce the advent of interface trap sites that might be induced by nitrogen at the substrate interface. Preferably, the nitrogen content in the upper interface is more than about 5 times the nitrogen content in the lower interface, more preferably about one order of magnitude greater.

The above description is particularly suited to transistor gate dielectric applications, in which the nitrogen-containing high k layers preferably have a thickness between about 20 Å and 60 Å. The described high k dielectric will also have other applications in integrated circuits. For example, for a dynamic random access memory (DRAM) application, a thicker high k layer can be employed, such as 150 Å to 200 Å in thickness, having ultrathin nitrogen-containing interfaces. Advantageously, an upper nitrogen-containing interface, as described above, can stabilize the high k material during subsequent processing. Depending upon the lower electrode materials, a lower nitrogen-containing interface can be omitted for a DRAM capacitor dielectric.

Preferred Processes for Forming High k Layer with N-containing Interfaces

The high k material, as described above, can be deposited by any suitable process, including PVD, CVD, MOCVD, ALD, etc. In the preferred embodiments, nitrogen incorporation is desirably achieved in a controlled fashion during deposition.

Conventionally, silicon oxide gate dielectric films are made by thermal oxidation of the underlying silicon substrate. To incorporate nitrogen, nitrogen-containing gases can be added to the main oxygen stream, and/or a post-deposition treatment can be performed with nitrogen-containing gases or nitrogen implantation. Such methods can either incorporate nitrogen into the oxide material to form silicon oxynitride ($SiO_xN_y$) or form a $Si_3N_4$ layer over the oxide. In other arrangements, oxide, whether deposited or thermally grown, are later treated for nitrogen incorporation by diffusion. In still other arrangements, nitrogen incorporation is varied during conventional thermal CVD, performed at relatively high temperatures, and interdiffusion inevitably takes place. In any of the prior art methods known to the inventors, it is difficult to control the nitrogen content in the film, especially for current and future generation of integrated circuit devices where the gate dielectric material is very thin (e.g., less than 7 nm). For such ultrathin dielectrics, conventional methods of incorporating nitrogen into a gate dielectric cannot be effectively controlled to provide two separate nitrogen peaks for both interfaces without also producing high nitrogen levels in the bulk of the dielectric.

Two embodiments are described hereinbelow: CVD with variable nitrogen incorporation through remotely generated nitrogen radicals, and ALD with variable nitrogen incorporation through varying the constituents of the plural cycles. ALD can optionally also employ nitrogen radicals in the controlled fashion described with respect to the CVD embodiment. Advantageously, both embodiments benefit from low temperature deposition, which helps to maintain the desired nitrogen profile. Preferably, deposition temperatures are below about 500° C. and more preferably below about 400° C.

CVD Deposition of High k Material with Nitrogen-containing Interfaces

In accordance with one aspect of the invention, a high k material is deposited with varying nitrogen content throughout the deposition process during chemical vapor deposition (CVD). Nitrogen is supplied by way of a remote plasma source 60, such as that described with respect to FIG. 1. The amount of nitrogen incorporated into the layer, as it is deposited, is varied at least in part by varying the supply of nitrogen radicals generated by the remote source.

It will be understood that this concept will have application to any of a number of deposition techniques. Preferably, high k metal oxide is deposited by a form of CVD employing metal-organic precursors (MOCVD). Advantageously, organic metal source gases tend to decompose at relatively low temperatures. For the preferred materials, a vapor phase, organic source of hafnium or zirconium is simultaneously provided with a vapor phase source of oxygen. Nitrogen is provided in the form of nitrogen radicals from a remote plasma source, advantageously also enabling low temperature reactions.

Preferably, the ratio of nitrogen radicals or excited species to oxygen is varied during the process to be higher at initial stages (representing the lower interface), low to zero during intermediate stages (representing the dielectric bulk) and higher again at the terminal stages (representing the upper interface). The nitrogen content in the deposited high k material is thereby varied in a controlled fashion, allowing for two separate nitrogen peaks (see, e.g., FIG. 9).

The relative amount of nitrogen can be varied in a variety of manners. In a first arrangement, the flow of nitrogen source gas (e.g., ammonia, diatomic nitrogen or hydrazine) through the remote plasma generator is varied, such that it is highest during terminal stages of the deposition, at an intermediate level during initial stages of the deposition, and lowest (e.g., zero) during intermediate stages of the deposition.

In a second arrangement, the flow of carrier gas through the remote plasma generator is varied. The skilled artisan will appreciate that such variation will have a non-linear effect upon the amount of nitrogen radicals generated. High carrier flow can support denser plasma generation and thus greater nitrogen radical concentration up to a point, but dilution due to greater overall gas flow during the CVD process can reduce nitrogen incorporation into the deposited film.

In a third arrangement, both oxygen source and nitrogen source gases are provided through the remote plasma generator. By ramping the power applied to the remote plasma generator, the relative rates of dissociation can be changed, thereby changing the relative generation of N radicals as compared to O radicals. For example, using $N_2$ as the nitrogen source and $O_2$ as the oxygen source, increasing power will increase dissociation of both sources up to a point. As power is increased further, the rate of $O_2$ dissociation will level off while the rate of $N_2$ dissociation continues to increase with increasing power. Alternatively, if the oxygen source is supplied separately and only nitrogen source and carrier gas are supplied to the remote plasma generator, altering power applied to the remote plasma generator will vary the amount of nitrogen excited species supplied to the CVD process in a straight forward manner. In one example, microwave power applied to a remote plasma processor can be varied between about 800 W and 2 kW.

ALD Deposition of High k Material with Nitrogen-containing Interfaces

In accordance with another preferred embodiment, the high k material is deposited by an atomic layer deposition (ALD) process. ALD is a chemically self-limiting process, whereby alternated pulses of reaction precursors saturate a substrate and leave no more than one monolayer of material per pulse. The precursors are selected to ensure self-saturating reactions, because at least one pulse per cycle leaves a chemisorbed species with a surface termination that is non-reactive with the gas phase reactants of the same pulse. Such a termination is left by "tails" or ligands of the source chemical, such as organic tails or halide tails. A subsequent pulse of different reactants do react with the tails left on the chemisorbed layer of a previous pulse to enable continued deposition. Thus, each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosures of which are incorporated herein by reference. In one arrangement, the deposition is conducted in a Pulsar™ 2000 reactor (commercially available from ASM Microchemistry of Espoo, Finland), which is designed for ALD processes. In another arrangement, the ALD tools of FIGS. 2A-2C can be employed with or without application of plasma power to the upper chamber.

ALD facilitates the formation of thin films monolayer by monolayer. Indeed, control exists on a smaller than monolayer scale, due to steric hindrance of bulky source chemical molecules producing less than one monolayer per cycle. The capability of layering atomically thin monolayers enables forming more precise concentration gradients from the lower surface (e.g., gate dielectric/Si substrate interface) to the upper surface (e.g., gate electrode/gate dielectric interface).

Accordingly, each discrete monolayer (or partial monolayer) can be tailored by selectively introducing the desired chemistry for each monolayer to be deposited. For example, by means of ALD, a particular combination of introduced gases react with, deposit or adsorb upon the workpiece until, by the nature of the deposition chemistry itself, the process self-terminates. Regardless of the length of exposure, the process gases do not contribute further to the deposition. To deposit subsequent monolayers, different chemical combinations are introduced in the process chamber such as will react with or adsorb upon the previously formed monolayer. Desirably, the second chemistry or a subsequent chemistry forms another monolayer, also in a self-limiting manner. These self-limiting monolayers are alternated as many times as desired to form a film of suitable thickness.

The very nature of this method allows a change of chemistry for each discrete cycle. Accordingly, the composition of the resulting thin film can be changed incrementally, for example, in each cycle, in every second cycle, or in any other desired progression. Additionally, because ALD can be conducted at very low temperatures, relative to conventional thermal oxidation and conventional CVD processes, diffusion during the process can be effectively limited. For the purpose of illustrating a ratio between oxide thickness and corresponding number of layers, a thin film of 60 Å zirconium oxide, for example, is formed by an ALD process alternating $ZrCl_4$ and $H_2O$ described below in about 100 cycles. Plenty of opportunity exists for tailoring the composition produced by each individual cycle, and the results of such compositional tailoring tend not to diffuse from their deposited positions due to the low temperature of the process. Thus, even for such an extremely thin layer, the composition can be changed such that a different impurity concentration can be incorporated into the first monolayer as compared to that incorporated into the last monolayer.

ALD of silicon oxide dielectric layers, with a graded nitrogen content, is disclosed in U.S. patent application Ser. No. 09/800,757, filed Mar. 6, 2001, entitled GRADED THIN FILMS, the disclosure of which is incorporated herein by reference.

The preferred embodiment modifies ALD deposition of a high k metal oxide by selectively incorporating nitrogen during selected stages of the deposition. A metal source gas, suitable for chemisorption of a self-limited partial or full monolayer per pulse, is alternated with an oxidant pulse. Exemplary oxidant source gases include oxygen, water, hydrogen peroxide, ozone, alcohols (e.g., methanol, ethanol, isopropanol), etc. In some arrangements (not specifically described herein), the process can include additional pulses, such as additional metal source pulses for more complex metal oxides, and gettering pulses for stripping ligands between pulses. A basic ALD process for deposition of $ZrCl_4$ is first described prior to describing two modifications employed for incorporating nitrogen, described below with respect to FIGS. 10 and 11.

In an exemplary ALD process for depositing $ZrO_2$, the reaction space is evacuated to vacuum with a mechanical vacuum pump. After evacuation the pressure of the reaction space was adjusted to about 5-10 mbar (absolute) with flowing nitrogen gas that had a purity of 99.9999%. Then the reaction space is stabilized at 300° C. A $ZrCl_4$ source is kept between about 180° C. and 210° C., more preferably about 200.

Each cycle of the ALD process comprises a plurality of pulses. $ZrCl_4$ vapor is introduced to the reaction chamber and exposed the wafer surface for 0.1 s. This is referred to as pulse A or the "metal pulse." The reaction chamber is purged with nitrogen gas for 1.0 s to remove surplus $ZrCl_4$ and byproducts from the reaction chamber. This is referred to as purge A. Then water vapor is introduced to the reaction chamber and exposed to the wafer surface for 0.3 s. This is referred to as pulse B or the "oxidant pulse." Residual $H_2O$ and reaction byproducts were removed by purging the reaction chamber for 3.0 s. This is referred to as purge B. During each of the reaction phases, the reactants are supplied in sufficient quantity for the given other parameters to saturate the surface.

This exemplary high-k deposition cycle is summarized in Table I.

TABLE I

| | | ZrO$_2$ | | |
|---|---|---|---|---|
| Phase | Reactant | Temperature (° C.) | Pressure (mbar) | Time (sec) |
| pulse A | ZrCl$_4$ | 300 | 5-10 | 0.1 |
| purge A | — | 300 | 5-10 | 1.0 |
| pulse B | H$_2$O | 300 | 5-10 | 0.3 |
| purge B | — | 300 | 5-10 | 3.0 |

The average deposition rate using the foregoing chemicals is about 0.59 Å/cycle at 300° C., such that the ZrO$_2$ thickness was about 30 Å. Similar process conditions using HrCl$_4$ in place of ZrCl$_4$ will produce HfO$_2$.

More generally, temperatures during the process preferably fall between about 250° C. and 500° C., more preferably between about 300° C. and 350° C., depending upon the acceptable levels of chlorine in the film. For an amorphous ZrO$_2$ or HfO$_2$ layer, the temperature is more preferably at the low end of this range, between about 200° C. and 250° C., and most preferably at about 225° C. For a crystalline film, the temperature is more preferably at the high end of this range, between about 250° C. and 500° C., and most preferably between about 300° C. and 350° C. As will be appreciated by the skilled artisan, however, mixtures of amorphous and crystalline composition result at the boundary of these two regimes. The illustrated process utilizes temperatures between about 300° C. and 350° C., producing a largely crystalline ZrO$_2$ or HfO$_2$ film. More generally, the metal pulse A preferably is conducted for between about 0.05 s and 1.0 s, purge A for between about 0.5 s and 10.0 s, oxidation pulse B for between about 0.05 s and 0.5 s and purge B for between about 0.5 s and 10.0 s.

The skilled artisan will appreciate that the pulse times in particular and all parameters in general can be varied within relatively large windows within which ALD reactions can occur. One of the stricter limitations for accomplishing truly self-limited reactions in ALD is that the temperature is preferably kept above the temperatures at which the source chemicals condense, but below the temperatures at which the source chemicals thermally decompose. Unlike CVD, however, deposition rates remain constant anywhere within this relatively large temperature window, such that strict temperature uniformity across a substrate is not required in order to accomplish conformal deposition.

In the example of Table I, the metal monolayer formed in the metal phase is self-terminated with chloride, which does not readily react with excess ZrCl$_4$ under the preferred conditions. The preferred oxygen source gas, however, reacts with or adsorbs upon the chloride-terminated surface during the oxygen phase in a ligand-exchange reaction limited by the supply of zirconium chloride complexes previously adsorbed. Moreover, oxidation leaves a hydroxyl and oxygen bridge termination that does not further react with excess oxidant in the saturative phase.

Preferably, sufficient cycles are conducted to grow between about 20 Å and 60 Å of ZrO$_2$. More preferably, sufficient cycles are conducted to grow between about 20 Å and 40 Å. The dielectric constant of pure zirconium oxide can range between about 18 and 24.

In accordance with the preferred embodiments, an impurity source gas is also provided to at least one of the cycles in the alternating process, selected to improve the functional qualities of the dielectric. The impurity preferably comprises nitrogen, and the impurity source gas preferably comprises ammonia (NH$_3$) or hydrazine (N$_2$H$_4$) added to the alternating process. Both ammonia and hydrazine are fairly reactive gases, making them suitable for low temperature ALD processing.

In a first arrangement (FIG. 10), nitrogen is incorporated during the oxidant pulses of selected cycles. In a second arrangement (FIG. 11), nitrogen is incorporated during selected cycles in its own separate pulses. In either arrangement, different amounts of nitrogen can be incorporated at different points in the deposition process, allowing for a high degree of control over nitrogen content even through the thickness of extremely thin layers, while low deposition temperatures minimize interdiffusion and ensure maintenance of the desired nitrogen profile.

Figure 10:
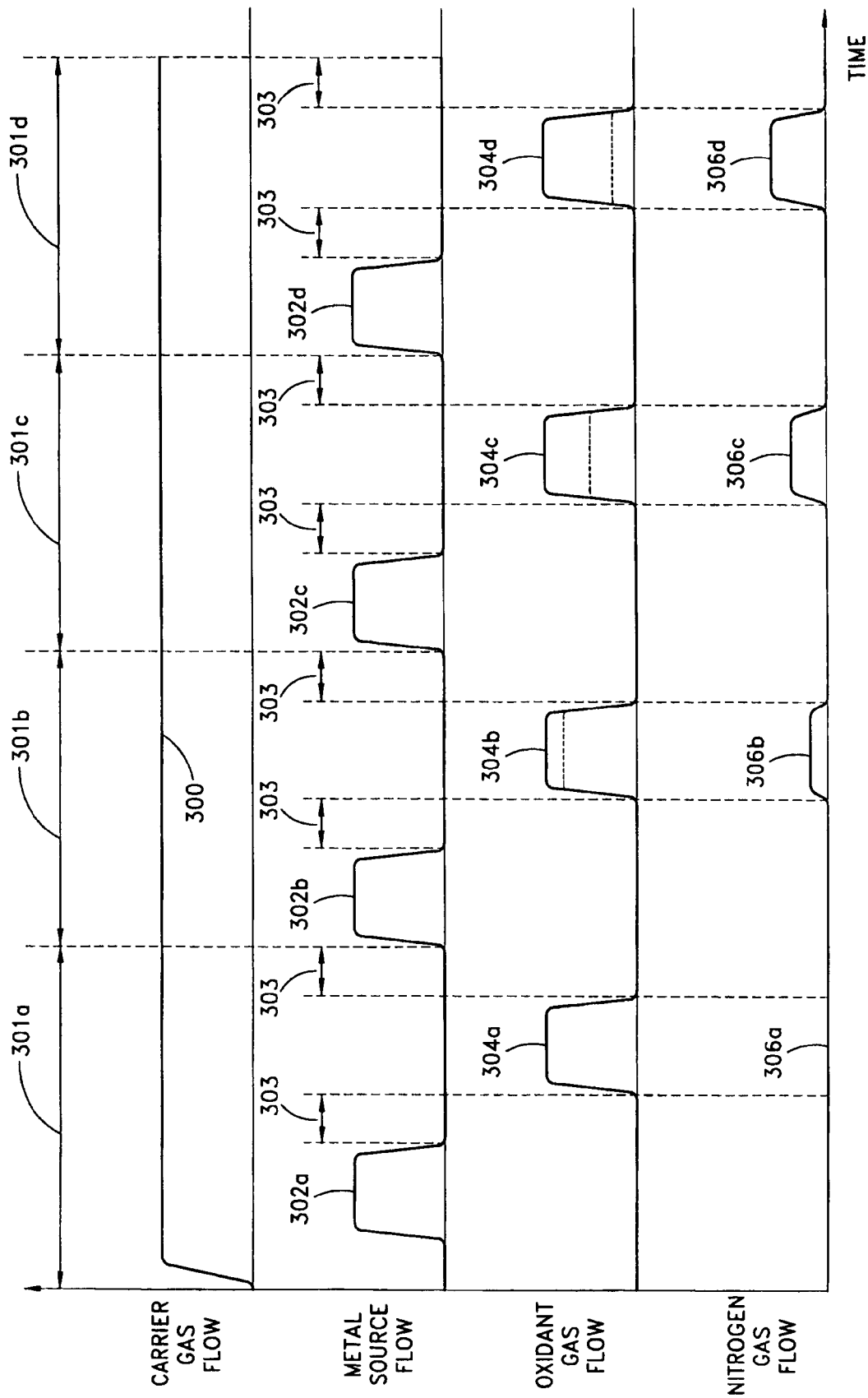
FIG. 10 is an exemplary gas flow diagram in accordance with a preferred ALD method of depositing ultrathin dielectric layers with controlled nitrogen content.

With reference to FIG. 10, the first arrangement involves alternating adsorption of no more than about a monolayer of metal with oxidation of the previously adsorbed monolayer in an ALD metal oxide process. During the oxidation stage, nitrogen can also be selectively incorporated. Essentially, by mixing nitrogen and oxygen source gases, oxynitride films with any desired ratio of oxygen to nitrogen can be grown. In the preferred embodiment, varying reactant ratios during the cyclical process, the composition formed by each cycle can be tailored. Most preferably, the deposition begins with metal oxynitride deposition, transitions to substantially pure metal oxide and ends with metal oxynitride.

In the illustrated embodiment, a highly reactive nitrogen source gas, such as ammonia or hydrazine, is added to the oxygen phase. Different amounts of NH$_3$ are added to different oxidant source gas pulses throughout the process. Thus, a desired amount of nitrogen can be selectively incorporated into each monolayer of metal oxide and a metal oxynitride layer results with a tailored nitrogen content profile.

The skilled artisan will appreciate, in view of the present disclosure, that the reaction between ammonia and the adsorbed metal complex will have a different thermodynamic favorability, as compared to the reaction between the oxidant and the metal complex. Accordingly, the proportions of ammonia to oxidant do not necessarily equal the proportions of nitrogen to oxygen in the resultant metal oxynitride. The skilled artisan can readily account for thermodynamic competition through routine experimentation to determine the appropriate parameters for the desired levels of nitrogen incorporation. Providing nitrogen active species through a remote plasma generator, particularly in conjunction with oxygen active species, can maximize the effect of varying the ratio of oxygen to nitrogen sources in a thermodynamically competitive single-pulse reaction.

FIG. 10 is a gas flow diagram in accordance with one embodiment, illustrating four cycles 301a-301d in an exemplary self-limiting deposition sequence. The four cycles might represent, for example, the last four cycles in forming the upper interface of the preferred high k dielectric. The illustrated sequence includes a constant flow of a carrier gas 300. As shown, a first pulse or spike 302a of the metal source gas is provided to form the first self-terminated metal complex monolayer. After a first purge step 303, during which carrier gas continues to flow until the metal source gas has been removed from the chamber, a first oxidant source gas pulse or spike 304a is provided. After a second purge 303, a second metal source gas pulse 302b is provided, followed by a second oxidant source gas 304b, a third metal source gas pulse 302c, a third oxidant source gas pulse 304c, etc. in alternating pulses separated by purge steps 303.

As shown, at some point after the first cycle 301a (forming a partial monolayer of metal oxide), a first impurity source gas pulse 306b is provided, preferably during an oxidant source gas pulse 304b. Desirably, a relatively low percentage of the impurity source gas (preferably comprising NH$_3$) is provided during this first pulse 306b. During subsequent oxidant source gas pulses 304c, 304d, etc., progressively greater flows of the impurity source gas are provided in pulses 306c, 306d, etc. Where progressively greater flows of the impurity source gas are employed, it can be advantageous to supply reactants perpendicularly to the substrate surface, such as by way of an overhead showerhead. In the case of competing adsorption of two source chemicals, all of the substrate surface is preferably exposed simultaneously to the gas mixture. The showerhead structures of FIGS. 2A-2C, configured for ALD by separation of precursor channels, are particularly advantageous for such simultaneous exposure, with or without activation of a plasma in the upper chamber. Thus, concentration gradients from an inlet side to the exhaust side of the substrate can be avoided.

Note that FIG. 10 is schematic only, and not drawn to scale. Additionally, the preferred process conditions actually result in a full monolayer formed after a plurality of cycles. While theoretically the reactants will chemisorb at each available site on the exposed layer of the workpiece, physical size of the adsorbed species (and particularly with terminating ligands) will generally limit coverage with each cycle to a fraction of a monolayer. In the illustrated embodiment, on average roughly 0.59 Å of ZrO$_2$ forms per cycle, such that a full monolayer effectively forms after several cycles, where each cycle is represented by a pair of metal source gas and oxidant source gas pulses.

As illustrated by dotted lines, the oxidant source gas pulses 304a, 304b, etc. can also be reduced in the course of increasing the impurity source gas flow, depending upon the materials and the desired. Accordingly, nitrogen content in the resultant metal oxynitride dielectric layer can be increased from 0 percent in the bulk up to a maximum desired level (preferably between about 1% and 10% nitrogen by atomic ratio) at the upper interface.

While the illustrated example comprises grading a nitrogen concentration in a simple metal oxide layer, skilled artisan will readily appreciate, in view of the disclosure herein, that the same principles can be applied to forming graded profiles in other gate dielectric materials, such as binary and ternary metal oxides (e.g., BST, SBT) by ALD. Also, while not shown in FIG. 10, additional gettering pulses can be provided to react with and volatilize harmful halides (e.g., Cl) and halide compounds (e.g., ammonium halides, hydrogen halides). Such gettering pulses can comprises supplying strong reducing agents, such as triethyl boron (TEB), in pulses to the substrate during the ALD process, preferably during each cycle.

FIG. 11 illustrates an arrangement in which nitrogen is added in separate nitrogen source gas pulses (e.g., each comprising an ammonia pulse and a purge pulse) following oxidant phases. When forming the preferred upper interface, for example, the nitrogen source gas pulse can replace or be used in addition to oxidant source gas pulses, such as one every ten cycles, during the terminal stages of deposition. In order to grade the nitrogen content, the frequency of nitrogen source gas pulses (e.g., relative to the frequency of metal source pulses) can be increased until the maximum desired nitrogen content is attained. When forming the preferred lower interface, a high frequency of nitrogen source gas pulses can be employed initially, followed by a reduction of the nitrogen pulse frequency to achieve a substantially nitrogen-free bulk metal oxide.

Thus, the basic alternating process depositing metal oxide (e.g., by alternating metal and oxidant pulses) initially is modified to deposit a lower interface of a metal oxynitride with relatively low levels of nitrogen (e.g., about 0.1% to 1% nitrogen by atomic ratio); continues with ALD of a substantially pure (e.g., less than about 0.1% nitrogen) metal oxide in an intermediate portion of the process; and, by the time the desired dielectric thickness is reached, the alternating process again increases the frequency of nitrogen pulses to produce an upper interface of metal oxynitride with relatively higher levels of nitrogen (e.g., about 1% to 10% nitrogen).

Advantageously, the process employs an intermediate reduction phase to remove halide tails, illustrated between metal and nitrogen source phases. This intermediate reduction phase avoids build up of hydrogen halides that could be harmful to exposed metal and reduces halide content in the dielectric. It will be understood, however, that in other arrangements the reduction phase can be performed in a different sequence or omitted.

TABLE II

| Pulse | Carrier Flow (slm) | Reactant | Reactant Flow (sccm) | Temperature (° C.) | Pressure (Torr) | Time (sec) |
| --- | --- | --- | --- | --- | --- | --- |
| metal | 400 | ZrCl$_4$ | 20 | 300 | 10 | 0.25 |
| purge | 400 | — | — | 300 | 10 | 1.0 |
| reduce | 400 | TEB | 40 | 300 | 10 | 0.05 |
| purge | 400 | — | — | 300 | 10 | 1.0 |
| oxidant | 400 | H$_2$O | 100 | 300 | 10 | 0.75 |
| purge | 400 | — | — | 300 | 10 | 1.0 |
| nitrogen | 400 | NH$_3$ | 100 | 300 | 10 | 0.75 |
| purge | 400 | — | — | 300 | 10 | 1.0 |

With reference to Table II above, an exemplary process recipe for forming the desired graded dielectric layer, will be described below. Four phases (each phase defined, in the illustrated embodiment, as including purge following reactant pulses) are described:

(1) a metal phase (e.g., ZrCl$_4$ pulse+purge);
(2) a reduction phase (e.g., TEB pulse+purge pulse);
(3) an oxidant phase (e.g., H$_2$O pulse+purge pulse);
(4) a nitrogen phase (e.g., NH$_3$ pulse+purge pulse);

Varying proportions of these phases are utilized during the continuous deposition process, depending upon the stage of the deposition process. In the illustrated embodiment, during initial stages, for example, phases (1)-(4) are employed, with a relative small frequency of the nitrogen phase (4) to result in a low nitrogen content (e.g., 0.1% to 1% nitrogen by atomic ratio) at the substrate interface. During intermediate stages, phases (1)-(3) are employed in order to form substantially pure ZrO$_2$ in the bulk. During terminal stages of the deposition, phases (1)-(4) are again employed, with a relatively greater frequency of phase (4) to result in a higher nitrogen content (e.g., 1% to 10% nitrogen by atomic ratio) at the gate electrode interface.

Note that the reduction phase (2) is optional for all stages of deposition. Advantageously, the reduction phase enables gettering halides left by the metal halide source gases. The reduction phase is thus preferably employed to reduce the chlorine content in the growing film. Note that the reduction phase, if employed, need not be employed in every cycle and, if employed in every cycle, need not be employed immediately subsequent to the metal phase.

FIG. 11 illustrates and Table II above presents parameters for cycles of an ALD process for depositing of a graded layer of metal oxide and metal oxynitride. Preferably the layer serves as gate dielectric between a semiconductor substrate and a transistor gate electrode layer. In the exemplary process recipe, a metal source gas comprises zirconium tetrachloride ($ZrCl_4$); a carrier gas comprises nitrogen ($N_2$); a reducing agent comprises triethyl boron (TEB); an oxidant source gas comprises water vapor ($H_2O$); and a nitrogen source gas comprises ammonia ($NH_3$).

Two three-phase cycles 450 are shown in FIG. 11. Such three-phase cycles 450 are conducted with highest frequency in forming the bulk of the dielectric, with lower frequency in forming the lower interface over the transistor channel, and with lowest frequency in forming the upper interface below the gate electrode.

One four-phase cycle 455 is also shown. In addition to the three phases of cycle 450, the four-phase cycle includes a nitrogen pulse and purge. Such four-phase cycles 455 are conducted with lowest frequency in forming the bulk of the dielectric, with higher frequency in forming the lower interface over the transistor channel, and with highest frequency in forming the upper interface below the gate electrode.

It will be understood that different impurities can be employed for the tailored dielectric. For example, the zirconium source gas pulse in a basic $ZrO_2$ ALD process can be periodically substituted by a trimethyl aluminum (TMA) pulse during initial deposition, forming an alumina-doped zirconium oxide lower interface. The TMA pulse can be provided with decreasing frequency until pure zirconium dioxide ($ZrO_2$) is formed for the bulk dielectric. In an exemplary process, TMA serves as an aluminum source gas and can be deposited at the same temperature (e.g., 300° C.) as the zirconium oxide ALD process. Alternatively, aluminum source gas can be introduced simultaneously and as an increasing proportion of the zirconium source gas during a metal pulse, which is continually alternating with an oxidant pulse. In this case, the skilled artisan can determine through routine experimentation what proportions of aluminum source gas to zirconium source gas should be used to obtain the desired material proportions in the layer. Similarly, the skilled artisan will readily appreciate that other gate dielectric materials can also be created in this fashion.

In the above example of aluminum oxide and zirconium oxide, aluminum oxide serves as a good barrier diffusion with good electrical interface properties, while zirconium dioxide provides a higher overall dielectric constant value for the dielectric. The gate dielectric can again be graded from a high aluminum content lower interface to substantially pure $ZrO_2$ to a high aluminum content upper interface. The aluminum content at the interface provides an amorphous, good diffusion barrier that stabilizes the dielectric against reaction with upper or lower materials.

In either of the above-described ALD arrangements, exemplified by FIGS. 10 and 11, for tailoring impurity concentration in an ultrathin (<7 nm) dielectric layer, the impurity can be supplied through a remote plasma generator. The supply of nitrogen excited species can be varied as described above with respect to the CVD embodiment. Advantageously, the reactors of FIGS. 2A-2C are particularly suited to supplying excited species to an ALD process, separately from other precursors.

It will be appreciated by those skilled in the art that various omissions, additions and modifications may be made to the processes described above without departing from the scope of the invention, and all such modifications and changes are intended to fall within the scope of the invention, as defined by the appended claims.

All references cited herein are expressly incorporated by reference.

We claim:

1. A gate dielectric layer in an integrated circuit comprising a graded concentration of aluminum, the dielectric comprising a lower interface having a first aluminum concentration, a bulk portion having a second aluminum concentration lower than the first aluminum concentration and an upper interface having a third aluminum concentration higher than the second aluminum concentration.

2. The dielectric layer of claim 1, which comprises zirconium oxide with a graded concentration of aluminum.

3. The dielectric layer of claim 1, which comprises hafnium oxide with a graded concentration of aluminum.

4. The dielectric layer of claim 1, which is less than 7 nm thick.

5. The dielectric layer of claim 1, wherein the bulk portion comprises substantially pure zirconium oxide.

* * * * *